(12) United States Patent
Kanno et al.

(10) Patent No.: US 8,877,425 B2
(45) Date of Patent: Nov. 4, 2014

(54) SILICON-CONTAINING RESIST UNDERLAYER FILM FORMING COMPOSITION HAVING FLUORINE-BASED ADDITIVE

(75) Inventors: Yuta Kanno, Toyama (JP); Makoto Nakajima, Toyama (JP); Tomoko Misaki, Funabashi (JP); Motonobu Matsuyama, Funabashi (JP); Masayuki Haraguchi, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 67 days.

(21) Appl. No.: 13/880,787

(22) PCT Filed: Oct. 20, 2011

(86) PCT No.: PCT/JP2011/074174
§ 371 (c)(1),
(2), (4) Date: Apr. 22, 2013

(87) PCT Pub. No.: WO2012/053600
PCT Pub. Date: Apr. 26, 2012

(65) Prior Publication Data
US 2013/0224957 A1    Aug. 29, 2013

(30) Foreign Application Priority Data

Oct. 22, 2010 (JP) .................. 2010-237288

(51) Int. Cl.
| | |
|---|---|
| *G03F 7/09* | (2006.01) |
| *G03F 7/20* | (2006.01) |
| *G03F 7/30* | (2006.01) |
| *G03F 7/36* | (2006.01) |
| *G03F 7/40* | (2006.01) |

(52) U.S. Cl.
USPC ........ 430/272.1; 430/311; 430/313; 430/323; 430/325; 430/326; 430/327; 430/330

(58) Field of Classification Search
None
See application file for complete search history.

(56) References Cited

U.S. PATENT DOCUMENTS

2006/0246373 A1* 11/2006 Wang .................... 430/270.1

FOREIGN PATENT DOCUMENTS

| JP | A-2004-31569 | 1/2004 |
|---|---|---|
| JP | A-2008-3592 | 1/2008 |
| JP | A-2009-199061 | 9/2009 |
| JP | A-2010-112966 | 5/2010 |

OTHER PUBLICATIONS

Nov. 15, 2011 International Search Report issued in International Patent Application No. PCT/JP2011/074174.
Nov. 15, 2011 Translation of the Written Opinion issued in International Patent Application No. PCT/JP2011/074174.

* cited by examiner

*Primary Examiner* — Sin J. Lee
(74) *Attorney, Agent, or Firm* — Oliff PLC

(57) ABSTRACT

A resist underlayer film forming composition for lithography includes: as a component (I), a fluorine-containing highly branched polymer obtained by polymerizing a monomer A having two or more radical polymerizable double bonds in the molecule thereof, a monomer B having a fluoroalkyl group and at least one radical polymerizable double bond in the molecule thereof, and a monomer D having a silicon atom-containing organic group and at least one radical polymerizable double bond in the molecule thereof, in the presence of a polymerization initiator C in a content of 5% by mole or more and 200% by mole or less, based on the total mole of the monomer A, the monomer B, and the monomer D; and as a component (II), a hydrolyzable silane compound, a hydrolysis product thereof, a hydrolysis-condensation product thereof, or a silicon-containing compound that is a combination of these compounds.

20 Claims, 1 Drawing Sheet

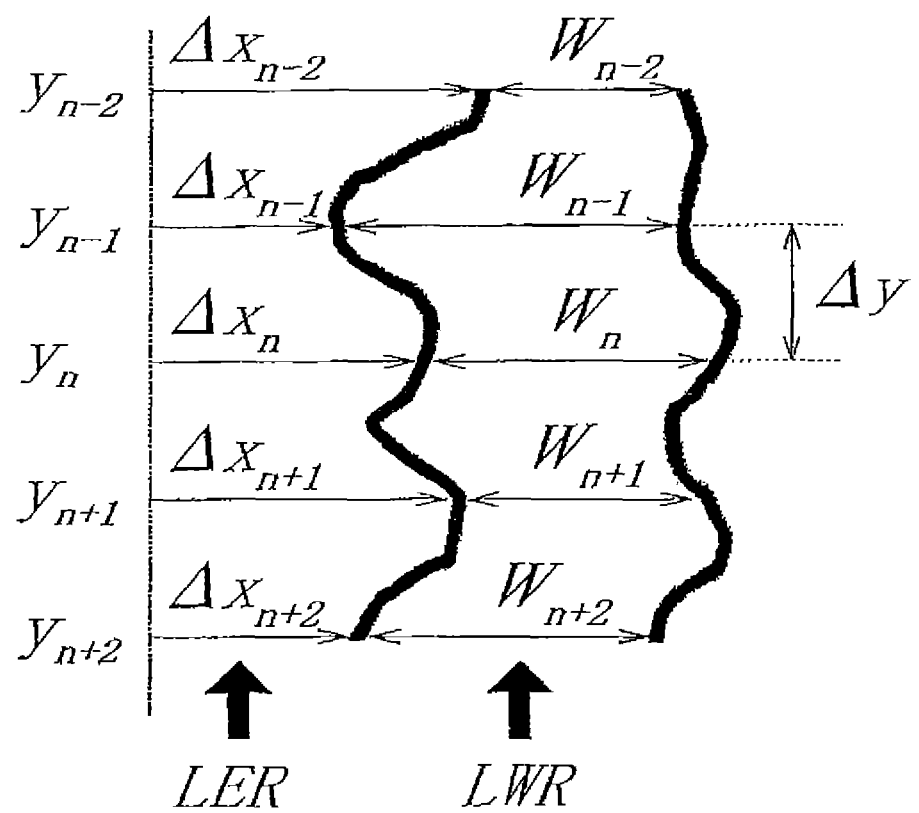

SILICON-CONTAINING RESIST UNDERLAYER FILM FORMING COMPOSITION HAVING FLUORINE-BASED ADDITIVE

TECHNICAL FIELD

The present invention relates to a composition for forming an underlayer film between a substrate and a resist (for example, a photoresist and an electron beam resist) that are used in the production of semiconductor devices. More in detail, the present invention relates to a resist underlayer film forming composition for lithography for forming an underlayer film used for an underlayer of a photoresist in a lithography process of the production of semiconductor devices. In addition, the present invention relates to a method of forming a resist pattern using the underlayer film forming composition and a method of producing a semiconductor device.

BACKGROUND ART

Conventionally, in the production of semiconductor devices, fine processing by lithography using a photoresist has been performed. The fine processing is a processing method for forming fine convexo-concave shapes corresponding to the following pattern on the surface of a substrate by: forming a thin film of a photoresist on a semiconductor substrate such as a silicon wafer; irradiating the resultant thin film with an active ray such as an ultraviolet ray through a mask pattern in which a pattern of a semiconductor device is depicted for development; and subjecting the substrate to etching processing using the resultant photoresist pattern as a protecting film.

Recently, the high integration of semiconductor devices has progressed and the adopted active ray tends to have a shorter wavelength, such as an ArF excimer laser (193 nm) replacing a KrF excimer laser (248 nm). Due to such a tendency, the influence of reflection of an active ray on a semiconductor substrate has become a large problem. Thus, in order to solve this problem, widely studied is a method of providing an anti-reflective coating (bottom anti-reflective coating) between the photoresist and the substrate.

For such an anti-reflective coating, many investigations on an organic anti-reflective coating composed of a polymer having a light absorbing group and the like are performed due to easiness of its use and so on. Examples thereof include: an acrylic resin-based anti-reflective coating having both a hydroxy group as a crosslinkable group and a light absorbing group within one molecule thereof; and a novolac resin-based anti-reflective coating having both a hydroxy group as a crosslinkable group and a light absorbing group within one molecule thereof.

As a characteristic required for the anti-reflective coating, there can be mentioned having a large absorbance to light or radiation, causing no intermixing with a photoresist (being insoluble in a photoresist solvent), causing no diffusion of low molecule substances from the anti-reflective coating to the photoresist as an upper layer during heating and baking, having a dry etching rate higher than that of the photoresist, and the like.

Furthermore, recently, in order to solve a problem of the wiring delay, which has become apparent as the refinement of a pattern rule of the semiconductor device has progressed, the use of copper as a wiring material has been studied. Along with it, a dual damascene process has been studied as a wiring forming method for the semiconductor substrate. In the dual damascene process, an anti-reflective coating is formed on a substrate which has a large aspect ratio and in which a via hole is formed. Therefore, for the anti-reflective coating used in this process, filling characteristics capable of filling holes without a void, planarization characteristics capable of forming a planar film on the substrate surface, and the like are required.

In addition, as an underlayer film placed between the semiconductor substrate and the photoresist, a film known as a hardmask containing a metal element such as silicon and titanium, is used.

As a method for eliminating an edge hump caused in an edge face of a substrate when the above resist underlayer film is applied onto the substrate, there is disclosed a method for forming an anti-reflective coating containing a fluorine-containing methacrylate polymer or oligomer (see Patent Document 1).

PRIOR-ART DOCUMENT

Patent Document

Patent Document 1: Japanese Patent Application Publication No. 2004-031569 (JP 2004-031569 A)

SUMMARY OF THE INVENTION

Problem to be Solved by the Invention

It is an object of the present invention to provide a resist underlayer film forming composition for lithography capable of being used in the production of a semiconductor device. More in detail, it is an object of the present invention to provide a resist underlayer film forming composition for lithography for forming a resist underlayer film capable of being used as a hardmask. In addition, it is an object of the present invention to provide a resist underlayer film forming composition for lithography for forming a resist underlayer film capable of being used as an anti-reflective coating. Furthermore, it is an object of the present invention to provide a resist underlayer film for lithography causing no intermixing with a resist and having a dry etching rate higher than that of the resist, and a resist underlayer film forming composition for forming the underlayer film.

Then, it is another object of the present invention to provide a resist pattern forming method using the resist underlayer film forming composition for lithography and a method of producing a semiconductor device as well.

Means for Solving the Problem

The present invention provides, according to a first aspect, a resist underlayer film forming composition for lithography containing: as a component (I), a fluorine-containing highly branched polymer obtained by polymerizing a monomer A having two or more radical polymerizable double bonds in the molecule thereof, a monomer B having a fluoroalkyl group and at least one radical polymerizable double bond in the molecule thereof, and a monomer D having a silicon atom-containing organic group and at least one radical polymerizable double bond in the molecule thereof, in the presence of a polymerization initiator C in a content of 5% by mole or more and 200% by mole or less, based on the total mole of the monomer A, the monomer B, and the monomer D; and as a component (II), a hydrolyzable silane compound, a hydrolysis product thereof, a hydrolysis-condensation product thereof, or a silicon-containing compound that is a combination of these compounds, according to a second aspect, the resist underlayer film forming composition according to the first aspect, in which the component (I) is a fluorine-containing highly branched polymer obtained by polymerizing a monomer A having two or more radical polymerizable double bonds in the molecule thereof, a monomer B having a fluoroalkyl group and at least one radical polymerizable double bond in the molecule thereof, and a monomer D having a silicon atom-containing organic group and at least one radical polymerizable double bond in the molecule thereof, in the presence of a polymerization initiator C having a fluoroalkyl group in the molecule thereof, in a content of 5% by mole or more and 200% by mole or less, based on the total mole of the monomer A, the monomer B, and the monomer D, according to a third aspect, the resist underlayer film forming composition according to the first aspect or the second aspect, in which the monomer A of the component (I) is a compound having any one of or both of a vinyl group and a (meth)acrylic group, according to a fourth aspect, the resist underlayer film forming composition according to any one of the first aspect to the third aspect, in which the monomer A of the component (I) is a divinyl compound or a di(meth)acrylate compound, according to a fifth aspect, the resist underlayer film forming composition according to any one of the first aspect to the third aspect, in which the monomer A of the component (I) is ethylene glycol di(meth)acrylate, according to a sixth aspect, the resist underlayer film forming composition according to any one of the first aspect to the fifth aspect, in which the component (I) is obtained by using the monomer A, the monomer B, and the monomer D in a ratio of the monomer B of 0.05 to 3 mole and a ratio of the monomer D of 0.05 to 5 mole, relative to 1 mole of the monomer A, according to a seventh aspect, the resist underlayer film forming composition according to any one of the first aspect to the sixth aspect, in which the monomer B and the monomer D of the component (I) are individually a compound having at least one vinyl group or at least one (meth)acrylic group, according to an eighth aspect, the resist underlayer film forming composition according to any one of the first aspect to the seventh aspect, in which the monomer B of the component (I) is a compound of Formula (1):

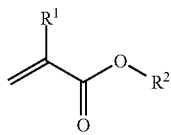

Formula (1)

(in Formula (1), $R^1$ is a hydrogen atom or a methyl group, and $R^2$ is a $C_{2-12}$ fluoroalkyl group optionally substituted with a hydroxy group), according to a ninth aspect, the resist underlayer film forming composition according to any one of the first aspect to the seventh aspect, in which the monomer B of the component (I) is a compound of Formula (2):

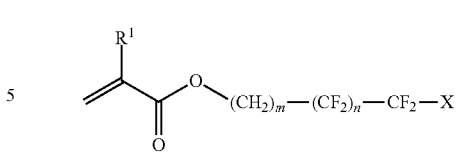

Formula (2)

(in Formula (2), $R^1$ is a hydrogen atom or a methyl group; X is a hydrogen atom or a fluorine atom; m is an integer of 1 or 2; and n is an integer of 0 to 5), according to a tenth aspect, the resist underlayer film forming composition according to any one of the first aspect to the ninth aspect, in which the monomer D of the component (I) is a compound of Formula (3):

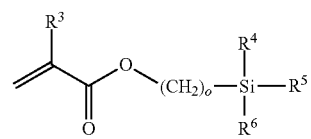

Formula (3)

(in Formula (3), $R^3$ is a hydrogen atom or a methyl group; $R^4$, $R^5$, and $R^6$ are individually a $C_{1-20}$ alkoxy group, a $C_{1-10}$ alkyl group, a $C_{2-10}$ alkenyl group, a $C_{2-40}$ alkynyl group, or a halogen-substituted group of these groups; and o is an integer of 1 to 10), according to an eleventh aspect, the resist underlayer film forming composition according to any one of the first aspect to the tenth aspect, in which the polymerization initiator C of the component (I) is an azo-based polymerization initiator, according to a twelfth aspect, the resist underlayer film forming composition according to the eleventh aspect, in which the polymerization initiator C of the component (I) is dimethyl 2,2'-azobisisobutyrate, according to a thirteenth aspect, the resist underlayer film forming composition according to the eleventh aspect, in which the polymerization initiator C of the component (I) is 2,2'-azobis(2,4,4-trimethylpentane), according to a fourteenth aspect, the resist underlayer film forming composition according to any one of the first aspect to the thirteenth aspect, in which the silicon-containing compound of the component (II) is at least one hydrolyzable silane compound selected from the group consisting of a silane compound of Formula (4):

$R^7{}_a Si(R^8)_{4-a}$ 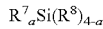 Formula (4)

(in Formula (4), $R^7$ is an alkyl group, an aryl group, a halogenated alkyl group, a halogenated aryl group, an alkenyl group, or a monovalent organic group having an epoxy group, an acryloyl group, a methacryloyl group, a mercapto group, or a cyano group and $R^7$ is bonded to the silicon atom in Formula (4) through a Si—C bond; and $R^8$ is an alkoxy group, an acyloxy group, or a halogen atom; and a is an integer of 0 to 3) and a silane compound of Formula (5):

$[R^9{}_c Si(R^{10})_{3-c}]_2 Y_b$ 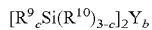 Formula (5)

(in Formula (5), $R^9$ is an alkyl group; $R^{10}$ is an alkoxy group, an acyloxy group, or a halogen atom; Y is an alkylene group or an arylene group; and b is an integer of 0 or 1 and c is an integer of 0 or 1, where when b=0, a single bond of Si—Si is formed), a hydrolysis product thereof, a hydrolysis-condensation product thereof, or a combination of these compounds, according to a fifteenth aspect, the resist underlayer film forming composition according to the fourteenth aspect, in which the component (II) contains a polymer containing a hydrolysis-condensation product of the silane compound of Formula (4), according to a sixteenth aspect, the resist underlayer film forming composition according to any one of the first aspect to the fifteenth aspect, further containing an acid as a hydrolysis catalyst, according to a seventeenth aspect, the resist underlayer film forming composition according to any one of the first aspect to the sixteenth aspect, further containing water, according to an eighteenth aspect, a resist underlayer film obtained by applying the resist underlayer film forming composition described in any one of the first aspect to the seventeenth aspect onto a semiconductor substrate and baking the composition, according to a nineteenth aspect, a method of producing a semiconductor device including: a process of applying the resist underlayer film forming composition described in any one of the first aspect to the seventeenth aspect onto a semiconductor substrate and baking the composition to form a resist underlayer film; a process of applying a composition for a resist onto the resist underlayer film to form a resist film; a process of exposing the resist film to light; a process of developing the resist after exposure to obtain a resist pattern; a process of etching the resist underlayer film according to the resist pattern; and a process of processing the semiconductor substrate according to the patterned resist film and the patterned resist underlayer film, and according to a twentieth aspect, a method of producing a semiconductor device including: a process of forming an organic underlayer film on a semiconductor substrate; a process of applying the resist underlayer film forming composition described in any one of the first aspect to the seventeenth aspect onto the organic underlayer film and baking the composition to form a resist underlayer film; a process of applying a composition for a resist onto the resist underlayer film to form a resist film; a process of exposing the resist film to light; a process of developing the resist after exposure to obtain a resist pattern; a process of etching the resist underlayer film according to the resist pattern; a process of etching the organic underlayer film according to a pattern of the patterned resist underlayer film; and a process of processing the semiconductor substrate according to a pattern of the patterned organic underlayer film.

Effects of the Invention

The resist underlayer film forming composition of the present invention is a resist underlayer film forming composition containing a fluorine-containing highly branched polymer that is the component (I). In a process of removing an unnecessary film attached to an edge face of the substrate as an edge hump when the composition is applied onto the substrate, the height of the edge hump can be reduced, so that the composition is useful for such a process.

The resist underlayer film obtained from the resist underlayer film forming composition of the present invention functions as a hardmask. That is, a hydrolyzable group such as an alkoxy group, an acyloxy group, and a halogen atom in a structure of the silicon-containing compound (such as compounds of Formula (4) and Formula (5)) as the component (II) is hydrolyzed or partially hydrolyzed and then, by a condensation reaction of the resultant silanol group, a polymer having a polysiloxane structure is formed. The polysiloxane structure has a satisfactory function as a hardmask. Therefore, the resist underlayer film formed from the resist underlayer film forming composition of the present invention has satisfactory dry etching resistance relative to an oxygen-based dry etching gas, so that the resist underlayer film is effective as a hardmask relative to etching of an organic underlayer film existing under the resist underlayer film or dry etching with an oxygen-based gas used for processing (etching) of the substrate.

BRIEF DESCRIPTION OF THE DRAWINGS

FIG. 1 is a schematic view for evaluating LWR (pattern width fluctuation) by measuring the line width $W_n$ at a measuring part $y_n$ relative to the number N of data in a y direction and indicating 3σ value thereof.

MODES FOR CARRYING OUT THE INVENTION

Although the resist underlayer film forming composition as the target of the present invention is specifically described later, for the composition, applications shown below are performed. That is, the resist underlayer film is formed either directly on the substrate or through an organic underlayer film on the substrate by a coating method using the composition, and on the resist underlayer film, a resist film (for example, photoresist and electron beam resist) is formed. Then, by exposure and development, a resist pattern is formed and the resist underlayer film is dry etched according to the resist pattern to transfer the pattern to the resist underlayer film. Then, the substrate is processed according to the pattern, or the pattern is transferred to the organic underlayer film by etching the organic underlayer film and the substrate is processed according to the pattern of the organic underlayer film.

Specifically, after the resist pattern is formed, the pattern is used as a mask and the resist underlayer film of the present invention existing under the resist pattern is dry etched with a halogen-containing gas to transfer the pattern to the resist underlayer film. Then, the pattern transferred to the resist underlayer film is used as a mask and the substrate is processed with a halogen-containing gas. Alternatively, the pattern transferred to the resist underlayer film is used as a mask, and the organic underlayer film under the resist underlayer film is dry etched with an oxygen-based dry etching gas to transfer the pattern to the organic underlayer film. Then, the organic underlayer film to which the pattern is transferred is used as a mask and the substrate is processed using a halogen-containing gas.

In recent years, in the formation of a fine pattern, for preventing pattern collapse, the film thickness of the resist tends to be smaller. In order to transfer an advantageous pattern to a film (resist underlayer film) existing under the resist film, due to thinning of the resist film, it is required that the resist underlayer film be an underlayer film having an etching rate higher than a dry etching rate of the upper resist film.

In view of such a situation, in the present invention, such a constitution has been studied that the substrate is coated with a resist underlayer film containing an inorganic silicon-based compound either through an organic underlayer film or not through an organic underlayer film and the resist underlayer film is coated with the resist film (organic resist film). The inventors of the present invention have focused on such a point of view that a dry etching rate of an organic component film is largely different from that of an inorganic component film according to the selection of the etching gas, that is, such a point of view that the dry etching rate of the organic component film is high with an oxygen-based gas and the dry etching rate of the inorganic component film is high with a halogen-containing gas, have found that it is possible to cause the dry etching rates of the laminated two layers to be largely different from each other by accordingly selecting these etching gasses, and have completed the present invention.

Hereinafter, the present invention is described in detail.

[Resist Underlayer Film Forming Composition]

The resist underlayer film forming composition of the present invention contains a fluorine-containing highly branched polymer as the component (I), a silicon-containing compound as the component (II), and a solvent.

Then, the resist underlayer film forming composition of the present invention may contain as an optional component, other additives generally used for a resist underlayer film forming composition such as an acid, water, an alcohol, a curing catalyst, an acid generator, other organic polymer compounds, a light absorbing compound, a surfactant, a rheology controlling agent, and an adhesion assistant.

The solid content in the resist underlayer film forming composition of the present invention is, for example, 0.5 to 50% by mass, 1 to 30% by mass, or 1 to 25% by mass. The solid content is a component remaining after the solvent component is removed from all components of the film (resist underlayer film) forming composition.

The ratio of the silicon-containing compound (hydrolyzable organosilane, hydrolysis product thereof, hydrolysis-condensation product thereof, or combination of these compounds) as the component (II) constituted in the above solid content is 20% by mass or more, for example, 50 to 99.9% by mass, 60 to 99.9% by mass, or 70 to 99.7% by mass.

Then, the component (I) and the component (II) can be used in an amount range of the component (I) of 0.1 to 5% by mass or 0.3 to 1.5% by mass, based on the mass of the component (II).

Alternatively, the component (I) and the component (II) can be used in an amount range of the fluorine-containing highly branched polymer as the component (I) of 0.00005 to 1 part(s) by mass, preferably 0.001 to 0.1 parts by mass, relative to 1 part by mass of the component (II).

[Component (I): Fluorine-Containing Highly Branched Polymer]

The fluorine-containing highly branched polymer as the component (I) used in the present invention can be obtained by polymerizing a monomer A having two or more radical polymerizable double bonds in the molecule thereof, a monomer B having a fluoroalkyl group and at least one radical polymerizable double bond in the molecule thereof, and a monomer D having a silicon atom-containing organic group and at least one radical polymerizable double bond in the molecule thereof, in the presence of a polymerization initiator C in a content of 5% by mole or more and 200% by mole or less, based on the total mole of the monomer A, the monomer B, and the monomer D.

In addition, the fluorine-containing highly branched polymer as the component (I) can be obtained by polymerizing a monomer A having two or more radical polymerizable double bonds in the molecule thereof, a monomer B having a fluoroalkyl group and at least one radical polymerizable double bond in the molecule thereof, and a monomer D having a silicon atom-containing organic group and at least one radical polymerizable double bond in the molecule thereof, in the presence of a polymerization initiator C having a fluoroalkyl group in the molecule thereof in a content of 5% by mole or more and 200% by mole or less, based on the total mole of the monomer A, the monomer B, and the monomer D.

<Monomer A>

In the present invention, the monomer A having two or more radical polymerizable double bonds in the molecule thereof is preferably a monomer having any one of or both of a vinyl group and a (meth)acrylic group, particularly preferably a divinyl compound or a di(meth)acrylate compound. In the present invention, the (meth)acrylate compound refers to both an acrylate compound and a methacrylate compound. For example, (meth)acrylic acid refers to acrylic acid and methacrylic acid.

Examples of such a monomer A include organic compounds shown in (A1) to (A7) below.

(A1) Vinyl-based hydrocarbon compound:

(A1-1) Aliphatic vinyl-based hydrocarbon compound: isoprene, butadiene, 3-methyl-1,2-butadiene, 2,3-dimethyl-1,3-butadiene, 1,2-polybutadiene, pentadiene, hexadiene, and octadiene (A1-2) Alicyclic vinyl-based hydrocarbon compound: cyclopentadiene, cyclohexadiene, cyclooctadiene, and norbornadiene (A1-3) Aromatic vinyl-based hydrocarbon compound: divinylbenzene, divinyltoluene, divinylxylene, tyrivinylbenzene, divinylbiphenyl, divinylnaphthalene, divinylfluorene, divinylcarbazole, and divinylpyridine (A-2) Vinyl ester, allyl ester, vinyl ether, allyl ether, and vinyl ketone:

(A2-1) Vinyl ester: divinyl adipate, divinyl maleate, divinyl phthalate, divinyl isophthalate, divinyl itaconate, and vinyl (meth)acrylate (A2-2) Allyl ester: diallyl maleate, diallyl phthalate, diallyl isophthalate, diallyl adipate, and ally(meth)acrylate (A2-3) Vinyl ether: divinyl ether, diethylene glycol divinyl ether, and triethylene glycol divinyl ether (A2-4) Allyl ether: diallyl ether, diallyloxyethane, triallyloxyethane, tetraallyloxyethane, tetraallyloxypropane, tetraallyloxybutane, and tetramethallyloxyethane (A2-5) Vinyl ketone: divinyl ketone and diallyl ketone (A3) (Meth)acrylic acid ester:

ethylene glycol di(meth)acrylate, triethylene glycol di(meth)acrylate, propylene glycol di(meth)acrylate, neopentyl glycol di(meth)acrylate, trimethylolpropane tri(meth)acrylate, ditrimethylolpropane tetra(meth)acrylate, glycerol tri(meth)acrylate, pentaerythritol tetra(meth)acryl ate, alkoxytitanium tri(meth)acrylate, 1,6-hexanediol di(meth)acrylate, 2-methyl-1,8-octanediol di(meth)acrylate, 1,9-nonanediol di(meth)acrylate, 1,10-decanediol di(meth)acrylate, tricyclodecane dimethanol di(meth)acrylate, dioxane glycol di(meth)acrylate, 2-hydroxy-1-acryloyloxy-3-methacryloyloxypropane, 2-hydroxy-1,3-di(meth)acryloyloxypropane, 9,9-bis[4-(2-(meth)acryloyloxyethoxy)phenyl]fluorene, undecylenoxyethylene glycol di(meth)acrylate, bis[4-(meth)acryloylthiophenyl]sulfide, bis[2-(meth)acryloylthioethyl]sulfide, 1,3-adamantanediol di(meth)acrylate, and 1,3-adamantanedimethanol di(meth)acrylate (A4) Vinyl-based compound having polyalkylene glycol chain:

polyethylene glycol (molecular weight: 300) di(meth)acrylate and polypropylene glycol (molecular weight: 500) di(meth)acrylate (A5) Nitrogen-containing vinyl-based compound:

diallylamine, diallyl isocyanurate, diallyl cyanurate, methylenebis(meth)acrylamide, and bismaleimide (A6) Silicon-containing vinyl-based compound:

dimethyldivinylsilane, divinylmethylphenylsilane, diphenyldivinylsilane, 1,3-divinyl-1,1,3,3-tetramethyldisilazane, 1,3-divinyl-1,1,3,3-tetraphenyldisilazane, and diethoxydivinylsilane (A7) Fluorine-containing vinyl-based compound:

1,4-divinylperfluorobutane, 1,6-divinylperfluorohexane, and 1,8-divinylperfluorooctane Among them, preferred are aromatic vinyl-based hydrocarbon compounds in the group (A1-3), a vinyl ester, an allyl ester, a vinyl ether, an allyl ether, and a vinyl ketone in the group (A2), (meth)acrylic acid esters in the group (A3), vinyl-based compounds having a polyalkyleneglycol chain in the group (A4), and nitrogen-containing vinyl-based compounds in the group (A5).

Particularly preferred are divinylbenzene belonging to the group (A1-3), diallyl phthalate belonging to the group (A2-2), ethylene glycol di(meth)acrylate, 1,3-adamantanedimethanol di(meth)acrylate, and tricyclodecanedimethanol di(meth)acrylate belonging to the group (A3), and methylenebis(meth)acrylamide belonging to the group (A5).

Among them, more preferred are divinylbenzene, ethylene glycol di(meth)acrylate, and tricyclodecanedimethanol di(meth)acrylate, particularly preferred is ethylene glycol di(meth)acrylate.

<Monomer B>

In the present invention, the monomer B having a fluoroalkyl group and at least one radical polymerizable double bond in the molecule thereof is preferably a monomer having at least one vinyl group or at least one (meth)acrylic group, particularly preferably a compound of Formula (1), more preferably a compound of Formula (2).

Examples of such a monomer B include 2,2,2-trifluoroethyl(meth)acrylate, 2,2,3,3,3-pentafluoropropyl(meth)acrylate, 2-(perfluorobutyl)ethyl(meth)acrylate, 2-(perfluorohexyl)ethyl(meth)acrylate, 2-(perfluorooctyl)ethyl(meth)acrylate, 2-(perfluorodecyl)ethyl(meth)acrylate, 2-(perfluoro-3-methylbutyl)ethyl(meth)acrylate, 2-(perfluoro-5-methylhexyl)ethyl(meth)acrylate, 2-(perfluoro-7-methyloctyl)ethyl(meth)acrylate, 1H,1H,3H-tetrafluoropropyl(meth)acrylate, 1H,1H,5H-octafluoropentyl(meth)acrylate, 1H,1H,7H-dodecafluoroheptyl(meth)acrylate, 1H,1H,9H-hexadecafluorononyl(meth)acrylate, 1H-1-(trifluoromethyetrifluoroethyl(meth)acrylate, 1H,1H,3H-hexafluorobutyl(meth)acrylate, 3-perfluorobutyl-2-hydroxypropyl(meth)acrylate, 3-perfluorohexyl-2-hydroxypropyl(meth)acrylate, 3-perfluorooctyl-2-hydroxypropyl(meth)acrylate, 3-(perfluoro-3-methylbutyl)-2-hydroxypropyl(meth)acrylate, 3-(perfluoro-5-methylhexyl)-2-hydroxypropyl(meth)acrylate, and 3-(perfluoro-7-methyloctyl)-2-hydroxypropyl(meth)acrylate.

In the present invention, the ratio of the monomer B to be copolymerized is, from the viewpoint of reactivity and surface modifying effect, preferably 0.05 mole to 3.0 mole, particularly preferably 0.1 mole to 1.5 mole of the monomer B, relative to 1 mole of the monomer A.

<Monomer D>

In the present invention, the monomer D having a silicon atom-containing organic group and at least one radical polymerizable double bond in the molecule thereof is preferably a monomer having at least one vinyl group or at least one (meth)acrylic group, particularly preferably a compound of Formula (3).

In Formula (3), $R^3$ is a hydrogen atom or a methyl group, and $R^4$, $R^5$, and $R^6$ are each independently a $C_{1-20}$ alkoxy group, a $C_{1-10}$ alkyl group, a $C_{2-10}$ alkenyl group, a $C_{2-10}$ alkynyl group, or a halogen-substituted group of these groups. o is an integer of 1 to 10, preferably an integer of 2 to 10.

The halogen-substituted group is a group in which at least one hydrogen atom in the above alkoxy group, alkyl group, alkenyl group, or alkynyl group is substituted with a halogen atom (fluorine atom, chlorine atom, bromine atom, or iodine atom).

Examples of the alkoxy group, alkyl group, alkenyl group, or halogen atom include groups exemplified in the definition of the group in the silane compounds of Formula (4) and Formula (5) in the below-described silicon-containing compound as the component (II).

Examples of the alkynyl group include an ethynyl group, a 1-propynyl group, a 2-propynyl group, a 1-butynyl group, a 2-butynyl group, a 3-butynyl group, a 1-methyl-2-propynyl group, a 1-pentynyl group, a 2-pentynyl group, a 3-pentynyl group, a 4-pentynyl group, a 1-methyl-2-butynyl group, a 1-methyl-3-butynyl group, a 2-methyl-3-butynyl group, a 3-methyl-1-butynyl group, a 1,1-dimethyl-2-propynyl group, a 2-ethyl-2-propynyl group, a 1-hexynyl group, a 2-hexynyl group, a 3-hexynyl group, a 4-hexynyl group, a 5-hexynyl group, a 1-methyl-2-pentynyl group, a 1-methyl-3-pentynyl group, a 1-methyl-4-pentynyl group, a 2-methyl-3-pentynyl group, a 2-methyl-4-pentynyl group, a 3-methyl-1-pentynyl group, a 3-methyl-4-pentynyl group, a 4-methyl-1-pentynyl group, a 4-methyl-2-pentynyl group, a 1,1-dimethyl-2-butynyl group, a 1,1-dimethyl-3-butynyl group, a 1,2-dimethyl-3-butynyl group, a 2,2-dimethyl-3-butynyl group, a 3,3-dimethyl-1-butynyl group, a 1-ethyl-2-butynyl group, a 1-ethyl-3-butynyl group, a 1-n-propyl-2-propynyl group, a 2-ethyl-3-butynyl group, a 1-methyl-1-ethyl-2-propynyl group, and a 1-isopropyl-2-propynyl group.

Specific examples of the monomer D include 3-methacryloxypropyltriethoxysilane, 3-methacryloxypropyltrimethoxysilane, 3-acryloyloxypropyltriethoxysilane, and 3-acryloyloxypropyltrimethoxysilane.

In the present invention, the ratio of the monomer D to be copolymerized is, from the viewpoint of reactivity and surface modifying effect, preferably 0.05 mole to 5 mole, particularly preferably 0.1 mole to 1.5 mole of the monomer D, relative to 1 mole of the monomer A.

<Another Monomer: Monomer E>

In the present invention, in addition to the monomer A, the monomer B, and the monomer D, further a monomer E can be subjected to copolymerization. The monomer E is a compound having at least one radical polymerizable double bond and no fluoroalkyl group in the molecule thereof.

Such a monomer E is preferably a compound having at least one vinyl group or at least one (meth)acrylic group, or a maleimide compound.

Particularly, the monomer E is preferably: a vinyl ether group-containing (meth)acrylate compound such as 2-(2-vinyloxyethoxy) ethylacrylate; an epoxy group-containing (meth)acrylate compound such as glycidyl methacrylate; an alkoxysilyl group-containing (meth)acrylate compound such as 3-methacryloxypropyltriethoxysilane; a maleimide compound such as cyclohexylmaleimide and N-benzylmaleimide; and a (meth)acrylic acid ester compound containing a structural unit of Formula (6) below.

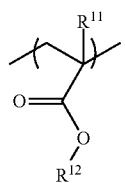

Formula (6)

(in Formula (6), $R^{11}$ is a hydrogen atom or a methyl group and $R^{12}$ is a monovalent organic group of Formula (6-1) to Formula (6-19):

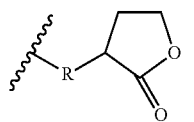
(6-1)

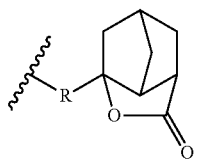
(6-2)

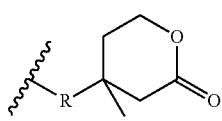
(6-3)

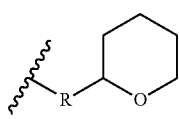
(6-4)

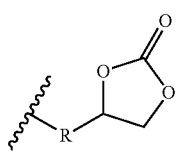
(6-5)

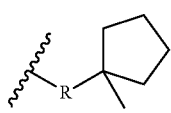
(6-6)

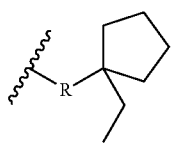
(6-7)

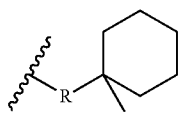
(6-8)

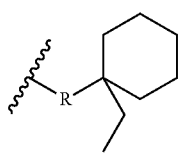
(6-9)

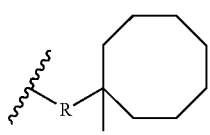
(6-10)

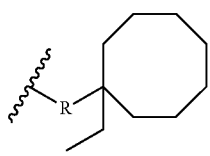
(6-11)

-continued

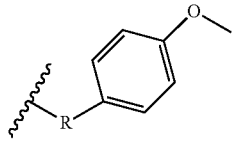
(6-12)

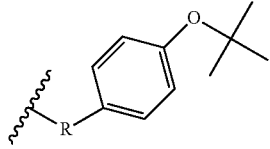
(6-13)

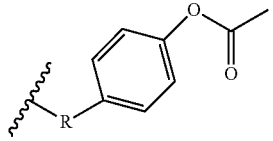
(6-14)

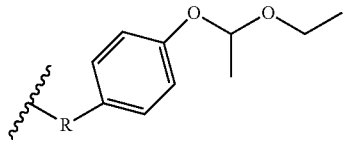
(6-15)

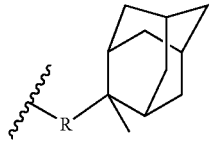
(6-16)

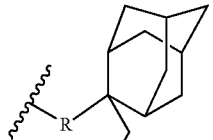
(6-17)

(6-18)

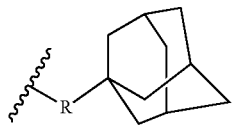
(6-19)

(in above formulae, R is a group bonded to an oxygen atom of a (meth)acrylate group and is a direct bond, a linear alkylene group, a branched alkylene group, an ether bond, an amide bond, an ester bond, a sulfide bond, or a combination thereof)).

The linear or branched alkylene group is a divalent organic group derived from an alkyl group and examples of the alkyl group include alkyl groups exemplified in the definition of the group in the silane compounds of Formula (4) and Formula (5) in the below-described silicon-containing compound as the component (II).

In the present invention, the ratio of the monomer E to be copolymerized is, from the viewpoint of reactivity and surface modifying effect, preferably 0.05 mole to 3.0 mole, particularly preferably 0.1 mole to 1.5 mole of the monomer E, relative to 1 mole of the monomer A.

<Polymerization Initiator C>

As the polymerization initiator C in the present invention, an azo-based polymerization initiator is preferably used. Examples of the azo-based polymerization initiator include compounds shown in (1) to (6) below.

(1) Azonitrile Compound:
2,2'-azobisisobutyronitrile, 2,2'-azobis(2-methylbutyronitrile), 2,2'-azobis(2,4-dimethylvaleronitrile), 1,1'-azobis(1-cyclohexanecarbonitrile), 2,2'-azobis(4-methoxy-2,4-dimethylvaleronitrile), and 2-(carbamoylazo)isobutyronitrile;

(2) Azoamide Compound:
2,2'-azobis{2-methyl-N-[1,1-bis(hydroxymethyl)-2-hydroxyethyl]propionamide}, 2,2'-azobis{2-methyl-N-[2-(1-hydroxybutyl)]propionamide}, 2,2'-azobis[2-methyl-N-(2-hydroxyethyl)propionamide], 2,2'-azobis[N-(2-propenyl)-2-methylpropionamide], 2,2'-azobis(N-butyl-2-methylpropionamide), and 2,2'-azobis(N-cyclohexyl-2-methylpropionamide);

(3) Cyclic Azoamidine Compound:
2,2'-azobis[2-(2-imidazoline-2-yl)propane]dihydrochloride, 2,2'-azobis[2-(2-imidazoline-2-yl)propane]disulfate dihydrate, 2,2'-azobis[2-[1-(2-hydroxyethyl)-2-imidazoline-2-yl]propane]dihydrochloride, 2,2'-azobis[2-(2-imidazoline-2-yl)propane], and 2,2'-azobis(1-imino-1-pyrrolidino-2-methylpropane)dihydrochloride;

(4) Azoamidine Compound:
2,2'-azobis(2-methylpropionamidine)dihydrochloride, and 2,2'-azobis[N-(2-carboxyethyl)-2-methylpropionamidine] tetrahydrate;

(5) Others:
dimethyl 2,2'-azobisisobutyrate, 4,4'-azobis-4-cyanovaleric acid, 2,2'-azobis(2,4,4-trimethylpentane), 1,1'-azobis(1-acetoxy-1-phenylethane), dimethyl-1,1'-azobis(1-cyclohexane carboxylate), and 4,4'-azobis(4-cyanopentanoic acid);

(6) Fluoroalkyl Group-Containing Azo-Based Polymerization Initiator:
4,4'-azobis(4-cyanopentanoic acid-2-(perfluoromethyl) ethyl), 4,4'-azobis(4-cyanopentanoic acid-2-(perfluorobutyl) ethyl), and 4,4'-azobis(4-cyanopentanoic acid-2-(perfluorohexyl)ethyl).

Among the above azo-based polymerization initiators, from the viewpoint of the surface energy of the obtained highly branched polymer, a polymerization initiator having a substituent having a relatively low polarity is desired and dimethyl 2,2'-azobisisobutyrate and 2,2'-azobis(2,4,4-trimethylpentane) are particularly preferred.

As the fluoroalkyl group-containing azo-based polymerization initiator, 4,4'-azobis(4-cyanopentanoic acid-2-(perfluoromethyl)ethyl) and 4,4'-azobis(4-cyanopentanoic acid-2-(perfluorohexyl)ethyl) can be preferably used.

The polymerization initiator C is used in an amount of 5% by mole to 200% by mole, preferably 15% by mole to 200% by mole, more preferably 15% by mole to 170% by mole, more preferably 50% by mole to 100% by mole, based on the total number of moles of the monomer A, the monomer B, and the monomer D.

<Method of Producing Fluorine-Containing Highly Branched Polymer>

The fluorine-containing highly branched polymer used in the present invention is obtained by polymerizing the monomer A, the monomer B and the monomer D in the presence of a predetermined amount of the polymerization initiator C. Examples of the polymerization method include a publicly known method such as a solution polymerization, a dispersion polymerization, a precipitation polymerization, and a bulk polymerization and among them, preferred are a solution polymerization and a precipitation polymerization. Particularly, from the viewpoint of control of the molecular weight, the reaction is preferably effected by a solution polymerization in an organic solvent.

Examples of the organic solvent used at this time include: aromatic hydrocarbon solvents such as benzene, toluene, xylene, ethylbenzene, and tetralin; aliphatic or alicyclic hydrocarbon solvents such as n-hexane, n-heptane, mineral spirit, and cyclohexane; halogen-based solvents such as methyl chloride, methyl bromide, methyl iodide, methylene dichloride, chloroform, carbon tetrachloride, trichloroethylene, perchloroethylene, and o-dichlorobenzene; ester or ester-ether solvents such as ethyl acetate, butyl acetate, methoxybutyl acetate, methylcellosolve acetate, ethylcellosolve acetate, and propylene glycol monomethyl ether acetate; ether solvents such as diethyl ether, tetrahydrofuran, 1,4-dioxane, methylcellosolve, ethylcellosolve, butylcellosolve, and propylene glycol monomethyl ether; ketone solvents such as acetone, methyl ethyl ketone, methyl-isobutyl ketone, di-n-butyl ketone, and cyclohexanone; alcohol solvents such as methanol, ethanol, n-propanol, isopropanol, n-butanol, isobutanol, tert-butanol, 2-ethylhexyl alcohol, and benzyl alcohol; amide solvents such as N,N-dimethylformamide and N,N-dimethylacetamide; sulfoxide solvents such as dimethylsulfoxide; heterocyclic compound solvents such as N-methyl-2-pyrrolidone; and a solvent mixture of two or more of these solvents.

Among them, preferred are aromatic hydrocarbon solvents, halogen-based solvents, ester solvents, ether solvents, ketone solvents, alcohol solvents, amide solvents, and sulfoxide solvents and particularly preferred are toluene, xylene, o-dichlorobenzene, butyl acetate, propylene glycol monomethyl ether acetate, propylene glycol monomethyl ether, 1,4-dioxane, methylcellosolve, methyl isobutyl ketone, N,N-dimethylformamide, and N,N-dimethylacetamide.

When the polymerization reaction is effected in the presence of an organic solvent, the content of the organic solvent in all polymerization reactants is preferably 1 to 100 parts by mass, further preferably 5 to 50 parts by mass, relative to 1 part by mass of the monomer A.

The polymerization reaction is effected under normal pressure, pressurized pressure in a sealed system, or reduced pressure and in terms of simplicity of the apparatus and the operation, the polymerization reaction is preferably effected under normal pressure. In addition, the polymerization reaction is preferably effected in an inert gas atmosphere such as $N_2$.

The temperature for the polymerization reaction is preferably 50 to 200° C., further preferably 70 to 150° C.

More preferably, the polymerization reaction is effected at a temperature higher than a temperature at which a half-life of the polymerization initiator C is 10 hours by 20° C. or more. More specifically, the polymerization reaction is preferably effected by dropping a solution containing the monomer A, the monomer B, the monomer D, the polymerization initiator C, and an organic solvent into the organic solvent maintained at a temperature higher than a temperature at which a half-life of the polymerization initiator C is 10 hours by 20° C. or more.

In addition, furthermore preferably, the polymerization reaction is effected at a reflux temperature of the organic solvent under a reaction pressure.

After the completion of the polymerization reaction, the obtained fluorine-containing highly branched polymer is recovered by any method and, if necessary, is subjected to a post-treatment such as washing. Examples of the method for recovering the polymer from the reaction mixture include a method such as reprecipitation.

The obtained fluorine-containing highly branched polymer has a weight average molecular weight (hereinafter, abbreviated as Mw) measured by gel permeation chromatography (GPC) in terms of polystyrene of preferably 1,000 to 200,000, further preferably 2,000 to 100,000, most preferably 5,000 to 60,000.

[Component (II): Silicon-Containing Compound]

The resist underlayer film forming composition of the present invention contains, as the component (II), a hydrolyzable silane compound, a hydrolysis product of the hydrolyzable silane compound, a hydrolysis-condensation product of the hydrolyzable silane compound, or a silicon-containing compound that is a combination of these compounds.

As the silicon-containing compound as the component (II), at least one hydrolyzable silane compound selected from the group consisting of the silicon-containing compounds of Formula (4) and the silicon-containing compounds of Formula (5), a hydrolysis product thereof, a hydrolysis-condensation product thereof, or a combination of these compounds can be used.

Among the silicon-containing compound selected from the group consisting of the silicon-containing compounds of Formula (4) and the silicon-containing compounds of Formula (5), the silicon-containing compounds of Formula (4) are preferably used. Then particularly, the hydrolysis-condensation product (polyorganosiloxane) of the silicon-containing compound of Formula (4) is preferably used.

Specific examples of the alkyl group, the aryl group, the halogenated alkyl group, the halogenated aryl group, the alkenyl group, and the organic group having an epoxy group, an acryloyl group, a methacryloyl group, a mercapto group, or a cyano group as $R^1$ and $R^3$ in the silicon-containing compounds of Formula (4) and Formula (5) and further, the alkoxy group, the acyloxy group, and the halogen atom as $R^2$ and $R^4$ can be exemplified as follows.

Example of the alkyl group include a linear or branched $C_{1-10}$ alkyl group such as a methyl group, an ethyl group, an n-propyl group, an isopropyl group, a cyclopropyl group, an n-butyl group, an isobutyl group, a sec-butyl group, a tert-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the aryl group include a $C_{6-10}$ aryl group such as a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of the alkenyl group include a $C_{2-10}$ alkenyl group such as an ethenyl(vinyl) group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethyl-ethenyl group, a 1-methyl-1-propenyl group, a 1-methyl-2-propenyl group, a 1-pentenyl group, a 2-pentenyl group, a 3-pentenyl group, a 4-pentenyl group, a 1-n-propyl-ethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-isopropyl-ethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butyl-etenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-sec-butyl-etenyl group, a 1,3-dimethyl-1-butenyl group, a 1,3-dimethyl-2-butenyl group, a 1,3-dimethyl-3-butenyl group, a 1-isobutyl-etenyl group, a 2,2-dimethyl-3-butenyl group, a 2,3-dimethyl-1-butenyl group, a 2,3-dimethyl-2-butenyl group, a 2,3-dimethyl-3-butenyl group, a 2-isopropyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-tert-butyl-etenyl group, a 1-methyl-1-ethyl-2-propenyl group, a 1-ethyl-2-methyl-1-propenyl group, a 1-ethyl-2-methyl-2-propenyl group, a 1-isopropyl-1-propenyl group, a 1-isopropyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the halogenated alkyl group or the halogenated aryl group include an alkyl group or an aryl group in which one or more hydrogen atom(s) is(are) substituted with a halogen atom(s) such as a fluorine atom, a chlorine atom, a bromine atom, and an iodine atom in the above alkyl group or the above aryl group.

Examples of the organic group having an epoxy group include a glycidoxymethyl group, a glycidoxyethyl group, a glycidoxypropyl group, a glycidoxybutyl group, and an epoxycyclohexyl group.

Examples of the organic group having an acryloyl group include an acryloylmethyl group, an acryloylethyl group, and an acryloylpropyl group.

Examples of the organic group having a methacryloyl group include a methacryloylmethyl group, a methacryloylethyl group, and a methacryloylpropyl group.

Examples of the organic group having a mercapto group include a mercaptoethyl group, a mercaptobutyl group, a mercaptohexyl group, and a mercaptooctyl group.

Examples of the organic group having a cyano group include a cyanoethyl group and a cyanopropyl group.

Examples of the alkoxy group include a $C_{1-20}$ alkoxy group having a linear, branched, or cyclic alkyl moiety such as a methoxy group, an ethoxy group, an n-propoxy group, an isopropoxy group, an n-butoxy group, an isobutoxy group, a sec-butoxy group, a tert-butoxy group, an n-pentyloxy(amyloxy) group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group.

Examples of the acyloxy group include a $C_{2-20}$ acyloxy group such as a methylcarbonyloxy (acetoxy group) group, an ethylcarbonyloxy group, an n-propylcarbonyloxy group, an isopropylcarbonyloxy group, a cyclopropylcarbonyloxy group, an n-butylcarbonyloxy group, an isobutylcarbonyloxy group, a sec-butylcarbonyloxy group, a tert-butylcarbonyloxy group, a cyclobutylcarbonyloxy group, a 1-methyl-cyclopropylcarbonyloxy group, a 2-methyl-cyclopropylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, a cyclopentylcarbonyloxy group, a 1-methyl-cyclobutylcarbonyloxy group, a 2-methyl-cyclobutylcarbonyloxy group, a 3-methyl-cyclobutylcarbonyloxy group, a 1,2-dimethyl-cyclopropylcarbonyloxy group, a 2,3-dimethyl-cyclopropylcarbonyloxy group, a 1-ethyl-cyclopropylcarbonyloxy group, a 2-ethyl-cyclopropylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, and a 1,1,2-trimethyl-n-propylcarbonyloxy group.

Examples of the halogen atom include a fluorine atom, a chlorine atom, a bromine atom, and an iodine atom.

Examples of the silicon-containing compound of Formula (4) include tetramethoxysilane, tetrachlorosilane, tetraacetoxysilane, tetraethoxysilane, tetra-n-propoxysilane, tetraisopropoxysilane, tetra-n-butoxysilane, methyltrimethoxysilane, methyltrichlorosilane, methyltriacetoxysilane, methyltripropoxysilane, methyltributoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, phenyltrimethoxysilane, phenyltrichlorosilane, phenyltriacetoxysilane, phenyltriethoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimethoxysilane, isopropoxybenzyltriethoxysilane, isopropoxybenzyltriacetoxysilane, isopropoxybenzyltrichlorosilane, tert-butoxyphenyltrimethoxysilane, tert-butoxyphenyltriethoxysilane, tert-butoxyphenyltriacetoxysilane, tert-butoxyphenyltrichlorosilane, tert-butoxybenzyltrimethoxysilane, tert-butoxybenzyltriethoxysilane, tert-butoxybenzyltriacetoxysilane, tert-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloyloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloyloxypropylmethyldimethoxysilane, γ-methacryloyloxypropylmethyldiethoxysilane, γ-mercaptopropylmethyldimethoxysilane, γ-mercaptomethyldiethoxysilane, methylvinyldimethoxysilane, and methylvinyldiethoxysilane.

Examples of the silicon-containing compound of Formula (5) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

The hydrolysis-condensation product (polyorganosiloxane) of the silicon-containing compound of Formula (4) or the hydrolysis-condensation product (polyorganosiloxane) of the silicon-containing compound of Formula (4) and the silicon-containing compound of Formula (5) has preferably a weight average molecular weight of 1,000 to 1,000,000, or 1,000 to 100,000.

The molecular weight of the hydrolysis-condensation product, is a molecular weight obtained by GPC analysis in terms of polystyrene and as the measuring conditions for GPC, for example, there are used a GPC apparatus (trade name: HLC-8220GPC; manufactured by Tosoh Corporation), a GPC column (trade name: Shodex KF803L, KF802, KF801; manufactured by Showa Denko K.K.), a column temperature of 40° C., an elute (elution solvent) of tetrahydrofuran, a flow amount (flow rate) of 1.0 mL/min, and a standard sample of polystyrene (manufactured by Showa Denko K.K.).

For obtaining the hydrolysis-condensation product, the hydrolysis is performed using water in an amount of 0.5 to 100 mole, preferably 1 to 10 mole, relative to 1 mole of the total of an alkoxysilyl group, an acyloxysilyl group, and a halogenated silyl group (that is, a $R^8$—Si— group, a $R^{10}$—Si— group). At this time, there can be used a hydrolysis catalyst in an amount of 0.001 to 10 mole, preferably 0.001 to 1 mole, relative to 1 mole of the above hydrolyzable group.

The reaction temperature for performing the hydrolysis and the condensation is usually 20 to 80° C.

The hydrolysis may be performed either completely or partially, that is, as described above, in the hydrolysis-condensation product, a hydrolysis product or a monomer may remain.

After the completion of the hydrolysis-condensation reaction, from the obtained hydrolysis-condensation product (polymer), an alcohol that is a by-product, a hydrolysis catalyst used for the reaction, and water can be simultaneously removed by distillation under reduced pressure or the like. The acid or the basic catalyst used for the hydrolysis can be removed by neutralization or ion exchange.

Examples of the hydrolysis catalyst include a metal chelate compound, an organic acid, an inorganic acid, an organic base, and an inorganic base.

Examples of the metal chelate compound as the hydrolysis catalyst include: titanium chelate compounds such as triethoxy-mono(acetylacetonate)titanium, tri-n-propoxy-mono(acetylacetonate)titanium, triisopropoxy-mono(acetylacetonate)titanium, tri-n-butoxy-mono(acetylacetonate)titanium, tri-sec-butoxy-mono(acetylacetonate)titanium, tri-tert-butoxy-mono(acetylacetonate)titanium, diethoxy-bis(acetylacetonate)titanium, di-n-propoxy-bis(acetylacetonate)titanium, diisopropoxy-bis(acetylacetonate)titanium, di-n-butoxy-bis(acetylacetonate)titanium, di-sec-butoxy-bis(acetylacetonate)titanium, di-tert-butoxy-bis(acetylacetonate)titanium, monoethoxy-tris(acetylacetonate)titanium, mono-n-propoxy-tris(acetylacetonate)titanium, monoisopropoxy-tris(acetylacetonate)titanium, mono-n-butoxy-tris(acetylacetonate)titanium, mono-sec-butoxy-tris(acetylacetonate)titanium, mono-tert-butoxy-tris(acetylacetonate)titanium, tetrakis(acetylacetonate)titanium, triethoxy-mono(ethylacetoacetate)titanium, tri-n-propoxy-mono(ethylacetoacetate)titanium, triisopropoxy-mono(ethylacetoacetate)titanium, tri-n-butoxy-mono(ethylacetoacetate)titanium, tri-sec-butoxy-mono(ethylacetoacetate)titanium, tri-tert-butoxy-mono(ethylacetoacetate)titanium, diethoxy-bis(ethylacetoacetate)titanium, di-n-propoxy-bis(ethylacetoacetate)titanium, diisopropoxy-bis(ethylacetoacetate)titanium, di-n-butoxy-bis(ethylacetoacetate)titanium, di-sec-butoxy-bis(ethylacetoacetate)titanium, di-tert-butoxy-bis(ethylacetoacetate)titanium, monoethoxy-tris(ethylacetoacetate)titanium, mono-n-propoxy-tris(ethylacetoacetate)titanium, monoisopropoxy-tris(ethylacetoacetate)titanium, mono-n-butoxy-tris(ethylacetoacetate)titanium, mono-sec-butoxy-tris(ethylacetoacetate)titanium, mono-tert-butoxy-tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium and tris(acetylacetonate)mono(ethylacetoacetate)titanium; zirconium chelate compounds such as triethoxy-mono(acetylacetonate)zirconium, tri-n-propoxy-mono(acetylacetonate)zirconium, triisopropoxy-mono(acetylacetonate)zirconium, tri-n-butoxy-mono(acetylacetonate)zirconium, tri-sec-butoxy-mono(acetylacetonate)zirconium, tri-tert-butoxy-mono(acetylacetonate)zirconium, diethoxy-bis(acetylacetonate)zirconium, di-n-propoxy-bis(acetylacetonate)zirconium, diisopropoxy-bis(acetylacetonate)zirconium, di-n-butoxy-bis(acetylacetonate)zirconium, di-sec-butoxy-bis(acetylacetonate)zirconium, di-tert-butoxy-bis(acetylacetonate)zirconium, mono ethoxy-tris(acetylacetonate)zirconium, mono-n-propoxy-tris(acetylacetonate)zirconium, monoisopropoxy-tris(acetylacetonate)zirconium, mono-n-butoxy-tris(acetylacetonate)zirconium, mono-sec-butoxy-tris(acetylacetonate)zirconium, mono-tert-butoxy-tris(acetylacetonate)zirconium, tetrakis(acetylacetonate)zirconium, triethoxy-mono(ethylacetoacetate)zirconium, tri-n-propoxy-mono(ethylacetoacetate)zirconium, triisopropoxy-mono(ethylacetoacetate)zirconium, tri-n-butoxy-mono(ethylacetoacetate)zirconium, tri-sec-butoxy-mono(ethylacetoacetate)zirconium, tri-tert-butoxy-mono(ethylacetoacetate)zirconium, diethoxy-bis(ethylacetoacetate)zirconium, di-n-propoxy-bis(ethylacetoacetate)zirconium, diisopropoxy-bis(ethylacetoacetate)zirconium, di-n-butoxy-bis(ethylacetoacetate)zirconium, di-sec-butoxy-bis(ethylacetoacetate)zirconium, di-tert-butoxy-bis(ethylacetoacetate)zirconium, mono ethoxy-tris(ethylacetoacetate)zirconium, mono-n-propoxy-tris(ethylacetoacetate)zirconium, monoisopropoxy-tris(ethylacetoacetate)zirconium, mono-n-butoxy-tris(ethylacetoacetate)zirconium, mono-sec-butoxy-tris(ethylacetoacetate)zirconium, mono-tert-butoxy-tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium and tris(acetylacetonate)mono(ethylacetoacetate)zirconium; and aluminum chelate compounds such as tris(acetylacetonate)aluminum and tris(ethylacetoacetate)aluminum.

Examples of the organic acid as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gala acid, butyric acid, mellitic acid, arachidonic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the hydrolysis catalyst include hydrochloric acid, nitric acid, sulfuric acid, hydrofluoric acid, and phosphoric acid.

Examples of the organic base as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclo-octane, diazabicyclo-nonane, diazabicyclo-undecene, and tetramethylammoniumhydroxide.

Examples of the inorganic base include ammonia, sodium hydroxide, potassium hydroxide, barium hydroxide, and calcium hydroxide.

Among these hydrolysis catalysts, metal chelate compounds, organic acids, and inorganic acids are preferred and these catalysts may be used individually or in combination of two or more of them.

Examples of the organic solvent used for the hydrolysis include: aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, and n-amylnaphthalene; monoalcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyalcohol solvents such as ethylene glycol, propylene glycol, 1,3-butylene glycol, pentanediol-2,4,2-methylpentanediol-2,4, hexanediol-2,5, heptanediol-2,4, 2-ethylhexanediol-1,3, diethylene glycol, dipropylene glycol, triethylene glycol, tripropylene glycol, and glycerin; ketone solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethyleneglycol monomethyl ether acetate, ethyleneglycol monoethyl ether acetate, diethyleneglycol monomethyl ether acetate, diethyleneglycol monoethyl ether acetate, diethyleneglycol mono-n-butyl ether acetate, propyleneglycol monomethyl ether acetate, propyleneglycol monoethyl ether acetate, propyleneglycol monopropyl ether acetate, propyleneglycol monobutyl ether acetate, dipropyleneglycol monomethyl ether acetate, dipropyleneglycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethylsulfoxide, sulfolane, and 1,3-propane sultone. These solvents may be used individually or in combination of two or more of them.

Among them, particularly, ketone solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone are preferred in terms of the preservation stability of the solution.

[Solvent]

The solvent used for the resist underlayer film forming composition of the present invention is not particularly limited to be used so long as the solvent is a solvent capable of dissolving the component (I): a fluorine-containing highly branched polymer, the component (II): a silicon-containing compound, and the other components such as the below-described curing catalyst.

Examples of such a solvent include methyl cellosolve acetate, ethyl cellosolve acetate, propylene glycol, propylene glycol monomethyl ether, propylene glycol monoethyl ether, methylisobutylcarbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol mono ethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, methyl 3-methoxy-2-methylpropionate, methyl 2-hydroxy-3-methylbutyrate, ethyl methoxyacetate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, methyl propyl ketone, methyl butyl ketone, 2-heptanone, 3-heptanone, 4-heptanone, N,N-dimethylformamide, N-methylacetamide, N,N-dimethylacetamide, N-methylpyrrolidone, and γ-butyrolactone.

These solvents may be used individually or in combination of two or more of them.

[Curing Catalyst]

The resist underlayer film forming composition of the present invention may further contain a curing catalyst. The curing catalyst accelerates the curing reaction when the coating film containing a polyorganosiloxane composed of a hydrolysis-condensation product is heated to be cured.

As the curing catalyst, there can be used ammonium salts, phosphines, phosphonium salts, and sulfonium salts.

Examples of the ammonium salt include: quaternary ammonium salts of Formula (F-1) to Formula (F-5) below; and tertiary ammonium salts of Formula (F-6) below.

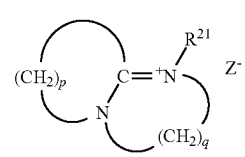

Formula (F-1)

(where p is an integer of 2 to 11; q is an integer of 2 to 3; $R^{21}$ is an alkyl group or an aryl group; and E is an anion)

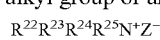

$R^{22}R^{23}R^{24}R^{25}N^+Z^-$   Formula (F-2)

(where $R^{22}$, $R^{23}$, $R^{24}$, and $R^{25}$ are each independently an alkyl group or an aryl group; N is a nitrogen atom; and $Z^-$ is an anion, where $R^{22}$, $R^{23}$, $R^{24}$, and $R^{25}$ are individually bonded to a nitrogen atom in Formula (F-2) through a C—N bond)

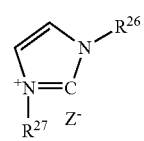

Formula (F-3)

(where $R^{26}$ and $R^{27}$ are each independently an alkyl group or an aryl group; and $Z^-$ is an anion)

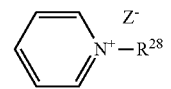

Formula (F-4)

(where $R^{28}$ is an alkyl group or an aryl group; and $Z^-$ is an anion)

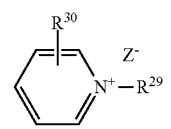

Formula (F-5)

(where $R^{29}$ and $R^{30}$ are each independently an alkyl group or an aryl group; and $Z^-$ is an anion)

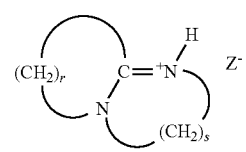

Formula (F-6)

(where r is an integer of 2 to 11; s is an integer of 2 to 3; H is a hydrogen atom; and is an anion)

Examples of the phosphonium salt include quaternary phosphonium salts of Formula (F-7) below.

$$R^{31}R^{32}R^{33}R^{34}P^+Z^-  \quad\quad \text{Formula (F-7)}$$

(where $R^{31}$, $R^{32}$, $R^{33}$, and $R^{34}$ are each independently an alkyl group or an aryl group; P is a phosphorus atom; and $Z^-$ is an anion, where $R^{31}$, $R^{32}$, $R^{33}$, and $R^{34}$ are individually bonded to a phosphorus atom in Formula (F-7) through a C—P bond)

Examples of the sulfonium salt include quaternary sulfonium salts of Formula (F-8) below.

$$R^{35}R^{36}R^{37}S^+Z^- \quad\quad \text{Formula (F-8)}$$

(where $R^{35}$, $R^{36}$, and $R^{37}$ are each independently an alkyl group or an aryl group; S is a sulfur atom; and $Z^-$ is an anion, where $R^{35}$, $R^{36}$, and $R^{37}$ are individually bonded to a sulfur atom in Formula (F-8) through a C—S bond)

The compound of Formula (F-1) is a quaternary ammonium salt derived from an amine. $R^{21}$ in Formula (F-1) is a $C_{1-18}$, preferably $C_{2-10}$ alkyl group or an aryl group and examples thereof include: linear alkyl groups such as an ethyl group, a propyl group, and a butyl group; branched or cyclic alkyl groups such as a cyclohexyl group and a cyclohexylmethyl group; aryl groups such as a benzyl group; and a dicyclopentadienyl group.

Examples of the anion ($Z^-$) include: halogen ions such as a chlorine ion ($Cl^-$), a bromine ion ($Br^-$), and an iodine ion ($I^-$); and ions containing an anionic group such as carboxylato ($-COO^-$), sulfonato ($-SO_3^-$), and alcoholate ($-O^-$).

The compound of Formula (F-2) is a quaternary ammonium salt derived from an amine and $R^{22}$, $R^{23}$, $R^{24}$, and $R^{25}$ in Formula (F-2) are each independently a $C_{1-15}$ alkyl group, an aryl group, or a silane compound bonded to a silicon atom through a Si—C bond.

Specific examples of the alkyl group, the aryl group, and the anion ($Z^-$) include examples exemplified with respect to Formula (F-1).

The quaternary ammonium salt of Formula (F-2) is commercially available and examples thereof include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (F-3) is a quaternary ammonium salt derived from 1-substituted imidazole and $R^{26}$ and $R^{27}$ in Formula (F-3) are each independently a $C_{1-18}$ group and the sum of the numbers of carbon atoms of $R^{26}$ and $R^{27}$ is preferably 7 or more. Examples of $R^{26}$ include a methyl group, an ethyl group, a propyl group, a phenyl group, and a benzyl group and examples of $R^{27}$ include a benzyl group, an octyl group, and an octadecyl group.

Specific examples of the anion ($Z^-$) include examples exemplified above with respect to Formula (F-1).

The compound of Formula (F-3) either is commercially available or can be produced by, for example, reacting an imidazole-based compound such as 1-methylimidazole and 1-benzylimidazole with halogenated alkyl or halogenated aryl such as benzyl bromide and methyl bromide.

The compound of Formula (F-4) is a quaternary ammonium salt derived from pyridine. $R^{28}$ in Formula (F-3) is a $C_{1-18}$, preferably $C_{4-18}$ alkyl group or an aryl group and examples thereof include a butyl group, an octyl group, a benzyl group, and a lauryl group.

Specific examples of the anion ($Z^-$) include examples exemplified above with respect to Formula (F-1).

The compound of Formula (F-4) either is commercially available or can be produced by, for example, reacting pyridine with halogenated alkyl or halogenated aryl such as lauryl chloride, benzyl chloride, benzyl bromide, methyl bromide, and octyl bromide. Examples of the compound include N-laurylpyridinium chloride and N-benzylpyridinium bromide.

The compound of Formula (F-5) is a quaternary ammonium salt derived from substituted pyridine represented by picoline (methylpyridine) and the like.

In Formula (F-5), $R^{29}$ is a $C_{1-18}$, preferably $C_{4-18}$ alkyl group or an aryl group and examples thereof include a methyl group, an octyl group, a lauryl group, and a benzyl group. $R^{30}$ is a $C_{1-18}$ alkyl group or an aryl group and when the compound is, for example, a quaternary ammonium derived from picoline, $R^{30}$ is a methyl group.

Specific examples of the anion ($Z^-$) include examples exemplified above with respect to Formula (F-1).

The compound of Formula (F-5) either is commercially available or can be produced by, for example, reacting substituted pyridine such as picoline with halogenated alkyl or halogenated aryl such as methyl bromide, octyl bromide, lauryl chloride, benzyl chloride, and benzyl bromide. Examples of the compound include N-benzylpicolinium chloride, N-benzylpicolinium bromide, and N-laurylpicolinium chloride.

The compound of Formula (F-6) is a tertiary ammonium salt derived from an amine. Specific examples of the anion ($Z^-$) include examples exemplified above with respect to Formula (F-1).

The compound of Formula (F-6) can be produced, for example, by a reaction of an amine with a weak acid such as a carboxylic acid and phenol.

Examples of the carboxylic acid include formic acid and acetic acid. When formic acid is used, the anion ($Z^-$) is ($HCOO^-$) and when acetic acid is used, the anion ($Z^-$) is ($CH_3COO^-$). When phenol is used, the anion ($Z^-$) is ($C_6H_5O^-$).

In the compound of Formula (F-7), $R^{31}$, $R^{32}$, $R^{33}$, and $R^{34}$ in Formula (F-7) are each independently a $C_{1-18}$ alkyl group, an aryl group, or a silane compound bonded to a silicon atom through a Si—C bond.

Preferably, three groups among the four groups of $R^{31}$ to $R^{34}$ are a phenyl group or a substituted phenyl group such as a phenyl group and a tolyl group and the last group is a $C_{1-18}$ alkyl group, an aryl group, or a silane compound bonded to a silicon atom through a Si—C bond.

Specific examples of the anion ($Z^-$) include examples exemplified above with respect to Formula (F-1).

The compound of Formula (F-7) is commercially available and examples of the compound include: halogenated tetraalkylphosphoniums such as a halogenated tetra-n-butylphosphonium and a halogenated tetra-n-propylphosphonium; halogenated trialkylbenzylphosphoniums such as a halogenated triethylbenzylphosphonium; halogenated triphenylmonoalkylphosphoniums such as a halogenated triphenylmethylphosphonium and a halogenated triphenylethylphosphonium; halogenated triphenylmonoarylphosphoniums such as a halogenated triphenylbenzylphosphonium; halogenated tetraphenylphosphoniums; halogenated tritolylmonoarylphosphoniums such as a halogenated tritolylmonophenylphosphonium; and halogenated tritolylmonoalkylphosphoniums such as a halogenated tritolylmonomethylphosphonium (where, the halogen atom is a chlorine atom or a bromine atom). Particularly preferred examples of the compound include: halogenated triphenylmonoalkylphosphoniums such as a halogenated triphenylmethylphosphonium and a halogenated triphenylethylphosphonium; halogenated triphenylmonoarylphosphoniums such as a halogenated triphenylbenzylphosphonium;

halogenated tritolylmonoarylphosphoniums such as a halogenated tritolylmonophenylphosphonium; and halogenated tritolylmonoalkylphosphoniums such as a halogenated tritolylmonomethylphosphonium (where, the halogen atom is a chlorine atom or a bromine atom).

Examples of the phosphines include: primary phosphines such as methylphosphine, ethylphosphine, propylphosphine, isopropylphosphine, isobutylphosphine, and phenylphosphine; secondary phosphines such as dimethylphosphine, diethylphosphine, diisopropylphosphine, diisoamylphosphine, and diphenylphosphine; and tertiary phosphines such as trimethylphosphine, triethylphosphine, triphenylphosphine, methyldiphenylphosphine, and dimethylphenylphosphine.

In the compound of Formula (F-8), $R^{35}$, $R^{36}$, and $R^{37}$ in Formula (F-8) are each independently a $C_{1-18}$ alkyl group or an aryl group. Preferably, two groups among the three substituents of $R^{35}$ to $R^{37}$ are a phenyl group or a substituted phenyl group such as a phenyl group and a tolyl group and the last group is a $C_{1-18}$ alkyl group or an aryl group.

Specific examples of the anion ($Z^-$) include examples exemplified above with respect to Formula (F-1).

The compound of Formula (F-8) is commercially available and examples of the compound include: halogenated trialkylsulfoniums such as a halogenated tri-n-butylsulfonium and a halogenated tri-n-propylsulfonium; halogenated dialkylbenzylsulfoniums such as a halogenated diethylbenzylsulfonium; halogenated diphenylmonoalkylsulfoniums such as a halogenated diphenylmethylsulfoniurn and a halogenated diphenylethylsulfonium; halogenated triphenylsulfoniums (where, the halogen atom is a chlorine atom or a bromine atom); trialkylphosphoniums carboxylate such as tri-n-butylsulfonium carboxylate and tri-n-propylsulfonium carboxylate; dialkylbenzylsulfoniums carboxylate such as diethylbenzylsulfonium carboxylate; diphenylmonoalkylsulfoniums carboxylate such as diphenylmethylsulfonium carboxylate and diphenylethylsulfonium carboxylate; and triphenylsulfoniums carboxylate. Particularly preferred examples of the compound include a halogenated triphenylsulfonium and a triphenylsulfonium carboxylate.

When the curing catalyst is added, the additive amount thereof is 0.01 to 10 parts by mass, 0.01 to 5 parts by mass, or 0.01 to 3 parts by mass, relative to 100 parts by mass of the polyorganosiloxane composed of the hydrolysis-condensation product.

[Organic Acid, Water, Alcohol]

In the resist underlayer film forming composition for lithography of the present invention, an organic acid, water, an alcohol, or a combination of two or more of them can be added for the stabilization of the composition.

Examples of the organic acid include oxalic acid, malonic acid, methylmalonic acid, succinic acid, maleic acid, malic acid, tartaric acid, phthalic acid, citric acid, glutaric acid, lactic acid, and salicylic acid. Among them, oxalic acid and maleic acid are preferred. When the organic acid is added, the additive amount thereof is 0.1 to 5.0 parts by mass, relative to 100 parts by mass of the hydrolysis-condensation product (polyorganosiloxane).

As the water to be added, pure water, ultrapure water, ion-exchanged water, or the like can be used and the additive amount thereof can be 1 to 20 part(s) by mass, relative to 100 parts by mass of the resist underlayer film forming composition.

As the alcohol to be added, an alcohol that is easily scattered by heating after the application of the composition is preferred and examples thereof include methanol, ethanol, propanol, isopropanol, and butanol. The additive amount of the alcohol can be 1 to 20 part(s) by mass, relative to 100 parts by mass of the resist underlayer film forming composition.

The underlayer film forming composition for lithography of the present invention may contain besides the above components, if necessary, an organic polymer compound, a photoacid generator, a surfactant, and the like.

[Organic Polymer Compound]

By using an organic polymer compound, there can be controlled the dry etching rate (a decreased amount of the film thickness per unit time), the attenuation coefficient, the refractive index, and the like of the resist underlayer film formed from the underlayer film forming composition for lithography of the present invention.

The organic polymer compound is not particularly limited and various organic polymers can be used. As the organic polymer compound, there can be used an addition-polymerized polymer and a condensation-polymerized polymer such as polyesters, polystyrenes, polyimides, acrylic polymers, methacrylic polymers, polyvinyl ethers, phenol novolacs, naphthol novolacs, polyethers, polyamides, and polycarbonates. When the organic polymer compound contains a hydroxy group, the hydroxy group can form a crosslink with polyorganosiloxane.

When an addition-polymerized polymer is used as the organic polymer compound, the polymer compound may be any one of a homopolymer and a copolymer. For producing the addition-polymerized polymer, an addition-polymerizable monomer is used. Examples of such an addition-polymerizable monomer include acrylic acid, methacrylic acid, acrylic acid ester compounds, methacrylic acid ester compounds, acrylamide compounds, methacrylamide compounds, vinyl compounds, styrene compounds, maleimide compounds, maleic anhydride, and acrylonitrile.

Examples of the acrylic acid ester compound include methyl acrylate, ethyl acrylate, n-hexyl acrylate, isopropyl acrylate, cyclohexyl acrylate, benzyl acrylate, phenyl acrylate, naphthyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic acid ester compound include methyl methacrylate, ethyl methacrylate, n-hexyl methacrylate, isopropyl methacrylate, cyclohexyl methacrylate, benzyl methacrylate, phenyl methacrylate, anthryl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinylnaphthalene, and vinylanthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylmaleimide, N-cyclohexylmaleimide, N-benzylmaleimide, and N-hydroxyethylmaleimide.

When a condensation-polymerized polymer is used as the polymer, examples of such a polymer include condensation-polymerized polymers of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride.

Examples of the condensation-polymerized polymer include: polyesters, polyamides, and polyimides such as polypyromellitimide, poly(p-phenyleneterephthalamide), polybutyleneterephthalate, and polyethyleneterephthalate; and phenol novolacs and naphthol novolacs.

Particularly, an organic polymer having an aromatic ring structure such as a benzene ring, a naphthalene ring, an anthracene ring, a triazine ring, a quinoline ring, and a quinoxaline ring, which functions as a light absorbing moiety, is preferably used.

Examples of such an organic polymer compound include: an addition-polymerized polymer containing as a structural unit thereof, an addition-polymerizable monomer such as benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenylmaleimide; and a condensation-polymerized polymer such as phenol novolac and naphthol novolac.

As the organic polymer compound, there can be used a polymer compound having a weight average molecular weight of, for example, 1,000 to 1,000,000, 3,000 to 300,000, 5,000 to 200,000, or 10,000 to 100,000.

The organic polymer compounds may be used individually or in combination of two or more of them.

When the organic polymer compound is used, the ratio thereof is 1 to 200 part(s) by mass, 5 to 100 parts by mass, 10 to 50 parts by mass, or 20 to 30 parts by mass, relative to 100 parts by mass of the hydrolysis-condensation product (polyorganosiloxane).

[Acid Generator]

The resist underlayer film forming composition of the present invention may contain an acid generator.

Examples of the acid generator include thermoacid generators and photoacid generators and in the present invention, a photoacid generator is preferably used.

The photoacid generator generates an acid during exposure of the resist to light. Therefore, the acidity of the underlayer film can be controlled. That is, the addition of the photoacid generator is one method for adjusting the acidity of the underlayer film to that of the upper resist film. By adjusting the acidity of the underlayer film, the control of the pattern shape of the resist formed in the upper layer is also possible.

Examples of the photoacid generator contained in the resist underlayer film forming composition of the present invention include onium salt compounds, sulfonimide compounds, and disulfonyl diazomethane compounds.

Examples of the onium salt compound include: iodonium salt compounds such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds such as triphenylsulfonium hexafluoroantimonate, triphenylsulfonium nonafluoro-n-butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro-n-butanesulfonyloxy)succinimide, N-(camphorsulfonyloxy)succinimide, and N-(trifluoromethanesulfonyloxy)naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

These photoacid generators may be used individually or in combination of two or more of them.

When the photoacid generator is used, the ratio thereof is 0.01 to 5 parts by mass, 0.1 to 3 parts by mass, or 0.5 to 1 part(s) by mass, relative to 100 parts by mass of the hydrolysis-condensation product (polyorganosiloxane).

In the resist underlayer film forming composition of the present invention, a rheology controlling agent, an adhesion assistant, and the like can be added. The rheology controlling agent is effective for enhancing the fluidity of the underlayer film forming composition. The adhesion assistant is effective for enhancing the adhesion of the underlayer film to the semiconductor substrate or the resist.

[Method of Producing Semiconductor Device]

The method of producing a semiconductor device using the resist underlayer film forming composition of the present invention includes: a process of applying the resist underlayer film forming composition of the present invention onto a semiconductor substrate and baking the composition to form a resist underlayer film; a process of applying a composition for a resist onto the resist underlayer film to form a resist film; a process of exposing the resist film to light; a process of developing the resist after the exposure to obtain a resist pattern; a process of etching the resist underlayer film according to the resist pattern; and a process of processing the semiconductor substrate according to the patterned resist film and the patterned resist underlayer film.

Such a method of producing a semiconductor device using the resist underlayer film forming composition of the present invention also is a target of the present invention. Hereinafter, the present invention is described in detail along each process.

Examples of the substrate used for the production of a semiconductor device include a silicon wafer substrate, a silicon/silicon dioxide coated substrate, a silicon nitride substrate, a glass substrate, an ITO substrate, a polyimide substrate, and a low dielectric constant material (low-k material) coated substrate.

Onto the substrate, the resist underlayer film forming composition of the present invention is applied by an appropriate coating method such as a spinner and a coater and then, is baked to form a resist underlayer film.

The baking conditions are accordingly selected from baking temperatures of 80° C. to 250° C. and baking times of 0.3 to 60 minutes. Preferably, the baking temperature is 150° C. to 250° C. and the baking time is 0.5 to 2 minutes.

The formed underlayer film has a film thickness of, for example, 10 to 1,000 nm, 20 to 500 nm, 50 to 300 nm, or 100 to 200 nm.

The resist underlayer film obtained using the resist underlayer film forming composition of the present invention also is a target of the present invention.

Next, on the resist underlayer film, for example, a resist layer (film) such as a photoresist is formed. The formation of the resist layer can be performed by a known method, that is, by applying a resist composition solution onto the resist underlayer film and baking the composition solution.

The resist layer has a film thickness of, for example, 50 to 10,000 nm, 100 to 2,000 nm, or 200 to 1,000 nm.

The photoresist formed on the resist underlayer film of the present invention is not particularly limited so long as the photoresist is sensitive to light used for the exposure, and both a negative-type photoresist and a positive-type photoresist can be used. Examples of the photoresist include: a positive-type photoresist made of a novolac resin and 1,2-naphthoquinonediazide sulfonic acid ester; a chemical amplification-type photoresist made of a binder having a group elevating the alkali dissolving rate by being decomposed by an acid, and a photoacid generator; a chemical amplification-type photoresist made of a low molecule compound elevating the alkali dissolving rate of a photoresist by being decomposed by an acid, an alkali-soluble binder, and a photoacid generator; and a chemical amplification-type photoresist made of a binder having a group elevating the alkali dissolving rate by being decomposed by an acid, a low molecule compound elevating the alkali dissolving rate of a photoresist by being decomposed by an acid, and a photoacid generator.

Specific examples of the photoresist include trade name: APEX-E manufactured by Shipley Company, L.L.C., trade name: PAR710 manufactured by Sumitomo Chemical Co., Ltd., and trade name: SEPR430 manufactured by Shin-Etsu Chemical Co., Ltd. The examples also include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

In the present invention, as the resist, a resist for electron beam lithography can be used instead of the photoresist. As the electron beam resist, both a positive type and a negative type can be used. Examples of the electron beam resist include: a non-chemical amplification-type resist made of a binder having a group changing the alkali dissolving rate by being decomposed by an electron beam; and a non-chemical amplification-type resist made of a binder having a moiety changing the alkali dissolving rate by being broken by an electron beam.

Next, the exposure is performed through a predetermined mask. For the exposure, a KrF excimer laser (wavelength: 248 nm), an ArF excimer laser (wavelength: 193 nm), an F2 excimer laser (wavelength: 157 nm), and the like can be used. After the exposure, if necessary, post exposure bake can also be performed. The post exposure bake is performed under conditions accordingly selected from baking temperatures of 70° C. to 150° C. and baking times of 0.3 to 10 minutes.

Also in the case of using the electron beam resist, a resist pattern can be formed in the same manner as in the case of using the photoresist, by using an electron beam as the radiating source.

Next, the development is performed by a developer. Consequently, for example, when a positive-type resist is used, the photoresist of an exposed part is removed to form a resist pattern.

Examples of the developer include alkaline aqueous solutions such as: aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine. Furthermore, in these developers, a surfactant and the like may also be added. The conditions for the development are accordingly selected from temperatures of 5 to 50° C. and times of 10 to 600 seconds.

Then, the thus formed pattern of the photoresist film (upper layer) is used as a protecting film and the etching (removal) of the resist underlayer film (intermediate layer) of the present invention is performed. Then, the film composed of the patterned photoresist and the patterned resist underlayer film (intermediate layer) of the present invention are used as a protecting film and the processing of the semiconductor substrate is performed.

First, the resist underlayer film (intermediate layer) of the present invention at the part where the photoresist is removed is removed by dry etching so that the semiconductor substrate is exposed.

For dry etching of the resist underlayer film of the present invention, there can be used gases such as tetrafluoromethane ($CF_4$), perfluorocyclobutane ($C_4F_8$), perfluoropropane ($C_3F_8$), trifluoromethane ($CHCF_3$), difluoromethane ($CH_2F_2$), carbon monoxide, argon, oxygen, nitrogen, sulfur hexafluoride, difluoromethane, nitrogen trifluoride and chlorine trifluoride, chlorine, and trichloroborane and dichloroborane.

Particularly, by dry etching with a halogen-based gas, basically, a photoresist composed of organic substances is difficult to be removed. On the contrary, an underlayer film containing a large amount of silicon atoms is immediately removed by a halogen-based gas, so that for dry etching of the resist underlayer film of the present invention, a halogen-based gas is preferably used. Herewith, the decrease of the film thickness of the photoresist according to dry etching of the resist underlayer film can be suppressed and as the result thereof, the photoresist can be used as a thin film.

For dry etching of the resist underlayer film of the present invention, particularly, a fluorine-based gas is preferably used and examples of the fluorine-based gas include tetrafluoromethane ($CF_4$), perfluorocyclobutane ($C_4F_8$), perfluoropropane ($C_3F_8$), trifluoromethane ($CHCF_3$), and difluoromethane ($CH_2F_2$).

Subsequently, the film composed of the patterned photoresist and the patterned resist underlayer film of the present invention are used as a protecting film, and the processing of the semiconductor substrate is performed. The processing of the semiconductor substrate is performed preferably by dry etching with a fluorine-based gas.

Examples of the fluorine-based gas include tetrafluoromethane ($CF_4$), perfluorocyclobutane ($C_4F_8$), perfluoropropane ($C_3F_8$), trifluoromethane ($CHCF_3$), and difluoromethane ($CH_2F_2$).

In the present invention, after forming the organic underlayer film on the substrate, the resist underlayer film of the present invention can be formed on the organic underlayer film and further, the resist underlayer film can be coated with the photoresist.

That is, another method of producing a semiconductor device of the present invention includes: a process of forming an organic underlayer film on a semiconductor substrate; a process of applying the resist underlayer film forming composition of the present invention onto the organic underlayer film and baking the composition to form a resist underlayer film; a process of applying a composition for a resist onto the resist underlayer film to form a resist film; a process of exposing the resist film to light; a process of developing the resist after the exposure to obtain a resist pattern; a process of etching the resist underlayer film according to the resist pattern; a process of etching the organic underlayer film according to a pattern of the patterned resist underlayer film; and a process of processing the semiconductor substrate according to a pattern of the pattered organic underlayer film.

The organic underlayer film can be formed using the same manner as in the cases of the underlayer film and the resist film.

Then, etching of the organic underlayer film is performed preferably by dry etching the organic underlayer film (underlayer) with an oxygen-based gas taking into consideration that the resist underlayer film of the present invention containing a large amount of silicon atoms is difficultly removed by dry etching with an oxygen-based gas.

Finally, the processing of the semiconductor substrate is performed using the patterned resist film (upper layer), the patterned resist underlayer film (intermediate layer), and the patterned organic underlayer film (underlayer) used as a protecting film.

In the present invention, by forming the organic underlayer film on the substrate, the pattern width of the photoresist can be made smaller, and even when the photoresist is coated thinly for preventing a pattern collapse, the processing of the substrate is possible by selecting an appropriate etching gas.

That is, by using a fluorine-based gas having an etching rate of the resist underlayer film satisfactorily higher than that of the photoresist as an etching gas for the resist underlayer film formed from the resist underlayer film forming composition of the present invention, by using an oxygen-based gas having an etching rate of the organic underlayer film satisfactorily higher than that of the resist underlayer film of the present invention as an etching gas for the organic underlayer film, and further by using a fluorine-based gas having an etching rate of the substrate satisfactorily higher than that of the organic underlayer film as an etching gas for the substrate, each of the resist underlayer film, the organic underlayer film, and the substrate can, be selectively processed.

In the present invention, as an upper layer of the resist underlayer film, an organic anti-reflective coating can be formed before the formation of the photoresist. The anti-reflective coating forming composition used here is not particularly limited and can optionally be selected from the compositions commonly used in a conventional lithography process to be used. In addition, the formation of the anti-reflective coating can be performed by a commonly used method, for example, by applying an anti-reflective coating forming composition by a spinner or a coater and by baking the composition.

The substrate onto which the resist underlayer film forming composition of the present invention is applied may also be a substrate having an organic or inorganic anti-reflective coating formed by a CVD method and the like on the surface thereof, and on the anti-reflective coating, the resist underlayer film of the present invention can also be formed.

A resist underlayer film formed from the resist underlayer film forming composition of the present invention can absorb light used in a lithography process depending on the wavelength of the light. Then, in such a case, the resist underlayer film can function as an anti-reflective coating having the effect of preventing reflection light on the substrate.

Furthermore, the resist underlayer film of the present invention can also be used as a layer for preventing an interaction between the substrate and the photoresist, a layer having a function of preventing an adverse action of a material used in the photoresist or of a substance generated during exposure of the photoresist to light against the substrate, a layer having a function of preventing the diffusion of a substance generated in or on the substrate during heating and baking to the upper layer photoresist, a barrier layer for reducing a poisoning effect to the photoresist layer by a semiconductor substrate dielectric layer, and the like.

A resist underlayer film formed from the resist underlayer film forming composition of the present invention can be applied to a substrate in which a via hole used in the dual damascene process is formed to be used as an embedding material capable of filling the hole without a void. The resist underlayer film can also be used as a planarizing material for planarizing the surface of a semiconductor substrate having unevenness.

EXAMPLE

Hereinafter, the present invention will be furthermore specifically described with reference to Examples that should not be construed as limiting the scope of the present invention.

Abbreviations mean as follows.
MAIB: Dimethyl 2,2'-azobisisobutyrate (manufactured by Otsuka Chemical Co., Ltd.; product name: MAIB)
C6FA: 2-(perfluorohexyl)ethylacrylate (manufactured by Daikin Chemical Sales Co., Ltd.; product name: R-1620)
TESMA: 3-methacryloxypropyltriethoxysilane (manufactured by Shin-Etsu Chemical Co., Ltd.; product name: KBE-503)
EGDMA: Ethylene glycol dimethacrylate (manufactured by Shin-nakamura Chemical Co., Ltd.; product name: 1 G)
GBLMA: α-methacryloxy-γ-butyrolactone (manufactured by Osaka Organic Chemical Industry Ltd.)
THF: Tetrahydrofuran Synthesis Example 1

Synthesis of Fluorine-Containing Highly Branched Polymer-1 (F Polymer-1)

Into a reaction flask, 16 g of toluene was charged and while toluene was stirred, nitrogen was flowed into the flask for 5 minutes, followed by heating the flask until the internal liquid was refluxed (to a temperature of about 110° C.).

Into another four-neck flask, 1.2 g (5 mmol) of MAIB, 2.1 g (5 mmol) of C6FA, 1.5 g (5 mmol) of TESMA, 2.0 g (10 mmol) of EGDMA, and 16 g of toluene were charged and while the resultant reaction mixture was stirred, nitrogen was flowed into the four-neck flask for 5 minutes to purge the inside of the four-neck flask with nitrogen, followed by cooling down the reaction mixture to 0° C. in an ice bath.

Into the above toluene under heating to reflux, the toluene solution dissolving EGDMA, C6FA, TESMA, and MAIB was dropped using a dropping pump over 30 minutes. After the completion of dropping, the resultant reaction mixture was aged for 1 hour.

Then, from the reaction mixture, 28 g of toluene was distilled off using a rotary evaporator and the resultant reaction mixture was charged into 198 g of hexane to precipitate a polymer in a slurry state. The resultant precipitate was filtered under reduced pressure and was vacuum-dried to obtain the objective highly branched F polymer-1 (3.4 g) as a white powder.

The objective had a weight average molecular weight Mw of 18,000 and a degree of dispersion: Mw (weight average molecular weight)/Mn (number average molecular weight) of 2.2 that were measured by GPC in terms of polystyrene.

Synthesis Example 2

Synthesis of Fluorine-Containing Highly Branched Polymer-2 (F Polymer-2)

Into a reaction flask, 32 g of toluene was charged and while toluene was stirred, nitrogen was flowed into the flask for 5 minutes, followed by heating the flask until the internal liquid was refluxed (water bath temperature: 110° C. or more).

Into another four-neck flask, 2.3 g (10 mmol) of MAIB, 4.2 g (10 mmol) of C6FA, 2.9 g (10 mmol) of TESMA, 1.0 g (6 mmol) of GBLMA, 4.0 g (20 mmol) of EGDMA, and 32 g of toluene were charged and while the resultant reaction mixture was stirred, nitrogen was flowed into the four-neck flask for 5 minutes to purge the inside of the four-neck flask with nitrogen, followed by cooling down the reaction mixture to 5° C. in an ice bath.

Into the above toluene under heating to reflux, the toluene solution dissolving C6FA, TESMA, GBLMA, EGDMA, and MAIB was dropped using a dropping pump over 30 minutes. After the completion of dropping, the resultant reaction mixture was heated to reflux for 1 hour.

Then, from the reaction mixture, the solvent was distilled off under reduced pressure and 23 g of THF was added to the resultant residue to exchange the solvents, followed by reprecipitating the resultant solution in 277 g of hexane. The resultant precipitate was filtered under reduced pressure and was vacuum-dried to obtain the objective highly branched F polymer-2 (5.8 g) as a white powder.

The objective had a weight average molecular weight Mw of 14,000 and a degree of dispersion: Mw (weight average molecular weight)/Mn (number average molecular weight) of 2.1 that were measured by GPC in terms of polystyrene.

Synthesis Example 3

Synthesis of Fluorine-Containing Highly Branched Polymer-3 (F Polymer-3)

Into a reaction flask, 32 g of toluene was charged and while toluene was stirred, nitrogen was flowed into the flask for 5 minutes, followed by heating the flask until the internal liquid is refluxed (water bath temperature: 110° C. or more).

Into another four-neck flask, 2.3 g (10 mmol) of MAIB, 4.2 g (10 mmol) of C6FA, 2.9 g (10 mmol) of TESMA, 1.7 g (10 mmol) of GBLMA, 4.0 g (20 mmol) of EGDMA, and 32 g of toluene were charged and while the resultant reaction mixture was stirred, nitrogen was flowed into the four-neck flask for 5 minutes to purge the inside of the four-neck flask with nitrogen, followed by cooling down the reaction mixture to 5° C. in an ice bath.

Into the above toluene under heating to reflux, the toluene solution dissolving C6FA, TESMA, GBLMA, EGDMA, and MAIB was dropped using a dropping pump over 30 minutes. After the completion of dropping, the resultant reaction mixture was heated to reflux for 1 hour.

Then, from the reaction mixture, the solvent was distilled off under reduced pressure and 20 g of THF was added to the resultant residue to exchange the solvents, followed by reprecipitating the resultant solution in 277 g of hexane. The resultant precipitate was filtered under reduced pressure and was vacuum-dried to obtain the objective highly branched F polymer-3 (11 g) as a white powder.

The objective had a weight average molecular weight Mw of 13,0000 and a degree of dispersion: Mw (weight average molecular weight) 1 Mn (number average molecular weight) of 2.3 that were measured by GPC in terms of polystyrene.

Synthesis Example 4

Synthesis of Fluorine-Containing Highly Branched Polymer-4 (F Polymer-4)

Into a reaction flask, 32 g of toluene was charged and while toluene was stirred, nitrogen was flowed into the flask for 5 minutes, followed by heating the flask until the internal liquid is refluxed (water bath temperature: 110° C. or more).

Into another four-neck flask, 2.3 g (10 mmol) of MAIB, 4.2 g (10 mmol) of C6FA, 2.9 g (10 mmol) of TESMA, 2.4 g (14 mmol) of GBLMA, 4.0 g (20 mmol) of EGDMA, and 32 g of toluene were charged and while the resultant reaction mixture was stirred, nitrogen was flowed into the four-neck flask for 5 minutes to purge the inside of the four-neck flask with nitrogen, followed by cooling down the reaction mixture to 5° C. in an ice bath.

Into the above toluene under heating to reflux, the toluene solution dissolving C6FA, TESMA, GBLMA, EGDMA, and MAIB was dropped using a dropping pump over 30 minutes. After the completion of dropping, the resultant reaction mixture was heated to reflux for 1 hour.

Then, from the reaction mixture, the solvent was distilled off under reduced pressure and 15 g of THF was added to the resultant residue to exchange the solvents, followed by reprecipitating the resultant solution in 277 g of hexane. The resultant precipitate was filtered under reduced pressure and was vacuum-dried to obtain the objective highly branched F polymer-4 (12 g) as a white powder.

The objective had a weight average molecular weight Mw of 16,000 and a degree of dispersion: Mw (weight average molecular weight)/Mn (number average molecular weight) of 3.5 that were measured by GPC in terms of polystyrene.

Synthesis Example 5

Synthesis of Fluorine-Containing Highly Branched Polymer-5 (F Polymer-5)

Into a reaction flask, 32 g of toluene was charged and while toluene was stirred, nitrogen was flowed into the flask for 5 minutes, followed by heating the flask until the internal liquid is refluxed (to about 110° C.).

Into another four-neck flask, 4.0 g (20 mmol) of EGDMA, 4.2 g (10 mmol) of C6FA, 2.3 g (10 mmol) of MAIB, and 32 g of toluene were charged and while the resultant reaction mixture was stirred, nitrogen was flowed into the four-neck flask for 5 minutes to purge the inside of the four-neck flask with nitrogen, followed by cooling down the reaction mixture to 0° C. in an ice bath.

Into the above toluene under heating to reflux, the toluene solution dissolving EGDMA, C6FA, and MAIB was dropped using a dropping pump over 30 minutes. After the completion of dropping, the resultant reaction mixture was aged for 1 hour.

Then, the reaction mixture was charged into 277 g of hexane/toluene (in mass ratio of 4/1) to precipitate a polymer in a slurry state. The slurry was filtered under reduced pressure and was re-dissolved in 36 g of THF and the resultant THF solution of a polymer was added to 277 g of hexane to reprecipitate a polymer in a slurry state. The resultant precipitate was filtered under reduced pressure and was vacuum-dried to obtain the objective highly branched F polymer-5 (4.9 g) as a white powder.

The objective had a weight average molecular weight Mw of 20,000 and a degree of dispersion: Mw (weight average molecular weight)/Mn (number average molecular weight) of 2.2 that were measured by GPC in terms of polystyrene.

Synthesis Example 6

Synthesis of Silicon Polymer-1 (Si Polymer-1)

14.58 g of tetraethoxysilane, 0.99 g of phenyltrimethoxysilane, 4.46 g of methyltriethoxysilane, and 30.05 g of acetone were charged and dissolved into a 100 mL flask. While being stirred with a magnetic stirrer, the reaction mixture solution was warmed to be refluxed. Then, 6.68 g of a 0.01 M hydrochloric acid aqueous solution was added to the mixture solution. The reaction was effected for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a hydrolysis-condensation product solution. Then, to the hydrolysis-condensation product solution, propylene glycol diethyl ether was added to finally obtain a hydrolysis-condensation product solution having a concentration of 15% by mass in terms of a solid content.

The obtained silicon polymer 1 (Si polymer 1) had a weight average molecular weight of Mw 1,600 measured by GPC in terms of polystyrene.

Synthesis Example 7

Synthesis of Silicon Polymer-2 (Si Polymer-2)

25.59 g (70% by mole) of tetraethoxysilane, 7.35 g (23.5% by mole) of methyltriethoxysilane, 1.74 g (5% by mole) of phenyltrimethoxysilane, 0.64 g (1.5% by mole) of (4-methoxybenzyl)trimethoxysilane, and 52.98 g of acetone were charged into a 200 mL flask and while the resultant mixed solution was stirred with a magnetic stirrer, thereinto, 11.70 g of 0.01 mol/L hydrochloric acid was dropped. After the completion of dropping, the flask was transferred into an oil bath controlled at 85° C. and the reaction was effected under warming to reflux for 240 minutes. Then, the resultant reaction solution was cooled down to room temperature and to the reaction solution, 35 g of propylene glycol monomethyl ether acetate was added. Ethanol that was a reaction by-product, water, and hydrochloric acid were distilled off under reduced pressure and the resultant reaction solution was concentrated to obtain a propylene glycol monomethyl ether acetate solution of a hydrolysis-condensation product (polymer). Thereto, propylene glycol monoethyl ether was added to make the solvent ratio of the resultant product solution be propylene glycol monomethyl ether acetate/propylene glycol monoethyl ether=20/80, so that the product solution was adjusted to have a concentration of 15% by mass in terms of a solid content at 140° C.

The obtained silicon polymer 2 (Si polymer 2) had a weight average molecular weight of Mw 1,600 measured by GPC in terms of polystyrene.

Synthesis Example 8

Synthesis of Silicon Polymer-3 (Si Polymer-3)

25.52 g (70% by mole) of tetraethoxysilane, 7.33 g (23.5% by mole) of methyltriethoxysilane, 1.73 g (5% by mole) of phenyltrimethoxysilane, 0.75 g (1.5% by mole) of (4-ethoxyethoxy)trimethoxysilylbenzene, and 53.27 g of acetone were charged into a 200 mL flask and while the resultant mixed solution was stirred with a magnetic stirrer, thereinto, 11.67 g of 0.01 mol/L hydrochloric acid was dropped. After the completion of dropping, the flask was transferred into an oil bath controlled at 85° C. and the reaction was effected under warming to reflux for 240 minutes. Then, the resultant reaction solution was cooled down to room temperature and to the reaction solution, 35 g of propylene glycol monomethyl ether acetate was added. Ethanol that was a reaction by-product, water, and hydrochloric acid were distilled off under reduced pressure and the resultant reaction solution was concentrated to obtain a propylene glycol monomethyl ether acetate solution of a hydrolysis-condensation product (polymer). Thereto, propylene glycol monoethyl ether was added to make the solvent ratio of the resultant product solution be propylene glycol monomethyl ether acetate/propylene glycol monoethyl ether=20/80, so that the product solution was adjusted to have a concentration of 15% by mass in terms of a solid content at 140° C.

The obtained silicon polymer 3 (Si polymer 3) had a weight average molecular weight of Mw 1,600 measured by GPC in terms of polystyrene.

Synthesis Example 9

Synthesis of Silicon Polymer-4 (Si Polymer-4)

24.53 g (70% by mole) of tetraethoxysilane, 7.50 g (25% by mole) of methyltriethoxysilane, 3.48 g (5% by mole) of 3-(triethoxysilylpropyl)diallyl isocyanurate, and 53.27 g of acetone were charged into a 200 mL flask and while the resultant mixed solution was stirred with a magnetic stirrer, thereinto, 11.22 g of 0.01 mol/L hydrochloric acid was dropped. After the completion of dropping, the flask was transferred into an oil bath controlled at 85° C. and the reaction was effected under warming to reflux for 240 minutes. Then, the resultant reaction solution was cooled down to room temperature and to the reaction solution, 32 g of propylene glycol monomethyl ether acetate was added. Ethanol that was a reaction by-product, water, and hydrochloric acid were distilled of under reduced pressure and the resultant reaction solution was concentrated to obtain a propylene glycol monomethyl ether acetate solution of a hydrolysis-condensation product (polymer). Thereto, propylene glycol monoethyl ether was added to make the solvent ratio of the resultant product solution be propylene glycol monomethyl ether acetate/propylene glycol monoethyl ether=20/80, so that the product solution was adjusted to have a concentration of 15% by mass in terms of a solid content at 140° C.

The obtained silicon polymer 4 (Si polymer 4) had a weight average molecular weight of Mw 1,500 measured by GPC in terms of polystyrene.

Synthesis Example 10

Synthesis of Silicon Polymer-5 (Si Polymer-5)

24.44 g (70% by mole) of tetraethoxysilane, 7.02 g (23.5% by mole) of methyltriethoxysilane, 3.47 g (5% by mole) of 3-(triethoxysilylpropyl)diallylisocyanurate, 0.61 g (1.5% by mole) of (4-methoxybenzyl)trimethoxysilane, and 53.27 g of acetone were charged into a 200 mL flask and while the resultant mixed solution was stirred with a magnetic stirrer, thereinto, 11.17 g of 0.01 mol/L hydrochloric acid was dropped. After the completion of dropping, the flask was transferred into an oil bath controlled at 85° C. and the reaction was effected under warming to reflux for 240 minutes. Then, the resultant reaction solution was cooled down to room temperature and to the reaction solution, 36 g of propylene glycol monomethyl ether acetate was added. Ethanol that was a reaction by-product, water, and hydrochloric acid were distilled off under reduced pressure and the resultant reaction solution was concentrated to obtain a propylene glycol monomethyl ether acetate solution of a hydrolysis-condensation product (polymer). Thereto, propylene glycol monoethyl ether was added to make the solvent ratio of the resultant product solution be propylene glycol monomethyl ether acetate/propylene glycol monoethyl ether=20/80, so that the product solution was adjusted to have a concentration of 15% by mass in terms of a solid content at 140° C.

The obtained silicon polymer 5 (Si polymer 5) had a weight average molecular weight of Mw 1,600 measured by GPC in terms of polystyrene.

Synthesis Example 11

Synthesis of Silicon Polymer-6 (Si Polymer-6)

24.37 g (70% by mole) of tetraethoxysilane, 7.00 g (23.5% by mole) of methyltriethoxysilane, 3.46 g (5% by mole) of (3-triethoxysilylpropyl)diallylisocyanurate, 0.72 g (1.5% by mole) of (4-ethoxyethoxy)trimethoxysilylbenzene, and 53.32 g of acetone were charged into a 200 mL flask and while the resultant mixed solution was stirred with a magnetic stirrer, thereinto, 11.14 g of 0.01 mol/L hydrochloric acid was dropped. After the completion of dropping, the flask was transferred into an oil bath controlled at 85° C. and the reaction was effected under warming to reflux for 240 minutes. Then, the resultant reaction solution was cooled down to room temperature and to the reaction solution, 32 g of propylene glycol monomethyl ether acetate was added. Ethanol that was a reaction by-product, water, and hydrochloric acid were distilled off under reduced pressure and the resultant reaction solution was concentrated to obtain a propylene glycol monomethyl ether acetate solution of a hydrolysis-condensation product (polymer). Thereto, propylene glycol monoethyl ether was added to make the solvent ratio of the resultant product solution be propylene glycol monomethyl ether acetate/propylene glycol monoethyl ether=20/80, so that the product solution was adjusted to have a concentration of 15% by mass in terms of a solid content at 140° C.

The obtained silicon polymer 6 (Si polymer 6) had a weight average molecular weight of Mw 1,600 measured by GPC in terms of polystyrene.

(Preparation of Resist Underlayer Film)

A fluorine-containing highly branched polymer of the fluorine-containing highly branched polymer 1 to the fluorine-containing highly branched polymer 5 (F polymer 1 to F polymer 5) obtained in Synthesis Example 1 to Synthesis Example 5, a silicon polymer of the silicon polymer 1 to the silicon polymer 6 (Si polymer 1 to Si polymer 6) obtained in Synthesis Example 6 to Synthesis Example 11, an acid, a curing catalyst, an additive, a solvent, and water were mixed in ratios listed in Table 1 and the resultant mixture was filtrated with a fluorine resin filter having a pore diameter of 0.1 μm to obtain each solution of resist underlayer film forming composition.

In Table 1, maleic acid is abbreviated as MA, benzyltriethylammonium chloride is abbreviated as BTEAC, N-(3-triethoxysilylpropyl)-4,5-dihydroimidazole is abbreviated as IMIDTEOS, monotriphenylsulfonium maleate is abbreviated as TPS-Male, bisphenol S is abbreviated as BPS, propylene glycol monomethyl ether acetate is abbreviated as PGMEA, and propylene glycol monoethyl ether is abbreviated as PGEE. As the water, ultrapure water was used. Each additive amount is expressed in a unit of parts by mass.

TABLE 1

| | F polymer | Si polymer | Acid | Curing catalyst | Additive | Solvent | | Water |
|---|---|---|---|---|---|---|---|---|
| Example 1 | F polymer 1 | Si polymer 1 | MA | BTEAC | BPS | PGMEA | PGEE | water |
| (parts by mass) | 0.01 | 2 | 0.06 | 0.012 | 2.5 | 7 | 80 | 13 |
| Example 2 | F polymer 2 | Si polymer 1 | MA | BTEAC | BPS | PGMEA | PGEE | water |
| (parts by mass) | 0.01 | 2 | 0.06 | 0.012 | 2.5 | 7 | 80 | 13 |
| Example 3 | F polymer 3 | Si polymer 1 | MA | BTEAC | BPS | PGMEA | PGEE | water |
| (parts by mass) | 0.01 | 2 | 0.06 | 0.012 | 2.5 | 7 | 80 | 13 |
| Example 4 | F polymer 4 | Si polymer 1 | MA | BTEAC | BPS | PGMEA | PGEE | water |
| (parts by mass) | 2 | 0.06 | 0.012 | 0.01 | 2.5 | 7 | 80 | 13 |
| Example 5 | F polymer 1 | Si polymer 2 | MA | BTEAC | | PGMEA | PGEE | water |
| (parts by mass) | 0.01 | 2 | 0.06 | 0.012 | | 7 | 80 | 13 |
| Example 6 | F polymer 2 | Si polymer 2 | MA | BTEAC | | PGMEA | PGEE | water |
| (parts by mass) | 0.01 | 2 | 0.06 | 0.012 | | 7 | 80 | 13 |
| Example 7 | F polymer 1 | Si polymer 3 | MA | BTEAC | | PGMEA | PGEE | water |
| (parts by mass) | 0.01 | 2 | 0.06 | 0.012 | | 7 | 80 | 13 |
| Example 8 | F polymer 2 | Si polymer 3 | MA | BTEAC | | PGMEA | PGEE | water |
| (parts by mass) | 0.01 | 2 | 0.06 | 0.012 | | 7 | 80 | 13 |
| Example 9 | F polymer 1 | Si polymer 4 | MA | BTEAC | | PGMEA | PGEE | water |
| (parts by mass) | 0.01 | 2 | 0.06 | 0.012 | | 7 | 80 | 13 |
| Example 10 | F polymer 2 | Si polymer 4 | MA | BTEAC | | PGMEA | PGEE | water |
| (parts by mass) | 0.01 | 2 | 0.06 | 0.012 | | 7 | 80 | 13 |
| Example 11 | F polymer 1 | Si polymer 5 | MA | BTEAC | | PGMEA | PGEE | water |
| (parts by mass) | 0.01 | 2 | 0.06 | 0.012 | | 7 | 80 | 13 |
| Example 12 | F polymer 2 | Si polymer 5 | MA | BTEAC | | PGMEA | PGEE | water |
| (parts by mass) | 0.01 | 2 | 0.06 | 0.012 | | 7 | 80 | 13 |
| Example 13 | F polymer 1 | Si polymer 6 | MA | BTEAC | | PGMEA | PGEE | water |
| (parts by mass) | 0.01 | 2 | 0.06 | 0.012 | | 7 | 80 | 13 |
| Example 14 | F polymer 2 | Si polymer 6 | MA | BTEAC | | PGMEA | PGEE | water |
| (parts by mass) | 0.01 | 2 | 0.06 | 0.012 | | 7 | 80 | 13 |
| Example 15 | F polymer 2 | Si polymer 1 | MA | IMIDTEOS | | PGMEA | PGEE | water |
| (parts by mass) | 0.01 | 2 | 0.06 | 0.012 | | 7 | 80 | 13 |
| Example 16 | F polymer 2 | Si polymer 1 | MA | TPS-Male | | PGMEA | PGEE | water |
| (parts by mass) | 0.01 | 2 | 0.06 | 0.012 | | 7 | 80 | 13 |

TABLE 1-continued

|  | F polymer | Si polymer | Acid | Curing catalyst | Additive | Solvent | | Water |
|---|---|---|---|---|---|---|---|---|
| Comparative Example 1 (parts by mass) | | Si polymer 1 2 | MA 0.06 | BTEAC 0.012 | BPS 2.5 | PGMEA 7 | PGEE 80 | water 13 |
| Comparative Example 2 (parts by mass) | F polymer 5 0.01 | Si polymer 1 2 | MA 0.06 | BTEAC 0.012 | BPS 2.5 | PGMEA 7 | PGEE 80 | water 13 |
| Comparative Example 3 (parts by mass) | | Si polymer 2 2 | MA 0.06 | BTEAC 0.012 | | PGMEA 7 | PGEE 80 | water 13 |
| Comparative Example 4 (parts by mass) | | Si polymer 3 2 | MA 0.06 | BTEAC 0.012 | | PGMEA 7 | PGEE 80 | water 13 |
| Comparative Example 5 (parts by mass) | | Si polymer 4 2 | MA 0.06 | BTEAC 0.012 | | PGMEA 7 | PGEE 80 | water 13 |
| Comparative Example 6 (parts by mass) | | Si polymer 5 2 | MA 0.06 | BTEAC 0.012 | | PGMEA 7 | PGEE 80 | water 13 |
| Comparative Example 7 (parts by mass) | | Si polymer 6 2 | MA 0.06 | BTEAC 0.012 | | PGMEA 7 | PGEE 80 | water 13 |

(Solvent Resistance Test)

Each of the resist underlayer film forming compositions prepared in Example 1 to Example 16 and Comparative Example 1 to Comparative Example 7 was applied onto a silicon wafer by a spin coating method and the composition was baked on a hot plate of 140° C. to form a resist underlayer film. Then, the resist underlayer film was immersed in propylene glycol monomethyl ether acetate used as a solvent of an over coating resist composition for 1 minute and when the change in the film thickness of a resist underlayer film formed from the composition between before and after the immersion was 1 nm or less, the composition was evaluated as "advantageous: ○". The obtained results are listed in Table 2.

TABLE 2

Results of solvent resistance test

|  | Solvent resistance |
|---|---|
| Example 1 | ○ |
| Example 2 | ○ |
| Example 3 | ○ |
| Example 4 | ○ |
| Example 5 | ○ |
| Example 6 | ○ |
| Example 7 | ○ |
| Example 8 | ○ |
| Example 9 | ○ |
| Example 10 | ○ |
| Example 11 | ○ |
| Example 12 | ○ |
| Example 13 | ○ |
| Example 14 | ○ |
| Example 15 | ○ |
| Example 16 | ○ |
| Comparative Example 1 | ○ |
| Comparative Example 2 | ○ |
| Comparative Example 3 | ○ |
| Comparative Example 4 | ○ |
| Comparative Example 5 | ○ |
| Comparative Example 6 | ○ |
| Comparative Example 7 | ○ |

(Optical Constants)

Each of the resist underlayer film forming compositions prepared in Example 1 to Example 16 and Comparative Example 1 to Comparative Example 7 was applied onto a silicon wafer using a spinner. The composition was heated on a hot plate at 240° C. for 1 minute to form a resist underlayer film (film thickness: 0.09 μm). Then, the refractive index (n value) and the optical absorptivity (k value; also called the attenuation coefficient) at a wavelength of 193 nm of the resist underlayer film were measured using a spectro-ellipsometer (VUV-VASE VU-302; manufactured by J.A. Woollam Corporation). The obtained results are listed in Table 3.

TABLE 3

Refractive index n and optical absorptivity k

|  | Refractive index n (wavelength 193 nm) | Optical absorptivity k (wavelength 193 nm) |
|---|---|---|
| Example 1 | 1.60 | 0.14 |
| Example 2 | 1.60 | 0.14 |
| Example 3 | 1.60 | 0.14 |
| Example 4 | 1.60 | 0.14 |
| Example 5 | 1.65 | 0.20 |
| Example 6 | 1.65 | 0.20 |
| Example 7 | 1.65 | 0.20 |
| Example 8 | 1.65 | 0.20 |
| Example 9 | 1.68 | 0.10 |
| Example 10 | 1.68 | 0.10 |
| Example 11 | 1.65 | 0.13 |
| Example 12 | 1.65 | 0.13 |
| Example 13 | 1.65 | 0.13 |
| Example 14 | 1.65 | 0.13 |
| Example 15 | 1.60 | 0.14 |
| Example 16 | 1.60 | 0.18 |
| Comparative Example 1 | 1.60 | 0.14 |
| Comparative Example 2 | 1.60 | 0.14 |
| Comparative Example 3 | 1.65 | 0.20 |
| Comparative Example 4 | 1.60 | 0.20 |
| Comparative Example 5 | 1.68 | 0.10 |
| Comparative Example 6 | 1.65 | 0.13 |
| Comparative Example 7 | 1.65 | 0.13 |

(Measurement of Dry Etching Rate)

Etchers and etching gases used in the measurement of dry etching rates are as follows.

$CF_4$ gas etching: etcher ES401 (trade name; manufactured by Nippon Scientific Co., Ltd.)

$O_2$ gas etching: etcher RIE-10NR (trade name; manufactured by Samco, Inc.)

Each of the solutions of the resist underlayer film forming composition prepared in Example 1 to Example 16 and Comparative Example 1 to Comparative Example 7 was applied onto a silicon wafer using a spinner. The composition solution was heated on a hot plate at 240° C. for 1 minute to form a resist underlayer film having a film thickness of 0.20 μm and a resist underlayer film having a film thickness of 0.04 μm.

The etching rate of the resist underlayer film having a film thickness of 0.20 μm was measured using a $CF_4$ gas as an etching gas and the etching rate of the resist underlayer film having a film thickness of 0.04 μm was measured using an $O_2$ gas as an etching gas.

In the same manner, a photoresist solution (trade name: UV 113; manufactured by Shipley Company, L.L.C.) was applied onto a silicon wafer using a spinner to form a resist film having a film thickness of 0.20 μm and a resist film having a film thickness of 0.04 μm. The dry etching rate of the resist film having a film thickness of 0.20 μm was measured using a $CF_4$ gas as an etching gas and the dry etching rate of the resist film having a film thickness of 0.04 μm was measured using an $O_2$ gas as an etching gas.

The comparison of the measured dry etching rate of the resist underlayer film with the measured dry etching rate of the resist film was evaluated as the dry etching rate ratio between the both films, that is, as the ratio of (dry etching rate of resist underlayer film)/(dry etching rate of resist film).

The obtained results are listed in Table 4.

TABLE 4

| | Dry etching rate ratio | |
|---|---|---|
| | $CF_4$ gas | $O_2$ gas |
| Example 1 | 1.65 | 0.02 |
| Example 2 | 1.65 | 0.02 |
| Example 3 | 1.67 | 0.02 |
| Example 4 | 1.69 | 0.02 |
| Example 5 | 1.69 | 0.02 |
| Example 6 | 1.70 | 0.02 |
| Example 7 | 1.71 | 0.02 |
| Example 8 | 1.71 | 0.02 |
| Example 9 | 1.84 | 0.02 |
| Example 10 | 1.85 | 0.02 |
| Example 11 | 1.90 | 0.02 |
| Example 12 | 1.91 | 0.02 |
| Example 13 | 1.92 | 0.02 |
| Example 14 | 1.92 | 0.02 |
| Example 15 | 1.67 | 0.02 |
| Example 16 | 1.65 | 0.02 |
| Comparative Example 1 | 1.70 | 0.02 |
| Comparative Example 2 | 1.65 | 0.02 |
| Comparative Example 3 | 1.69 | 0.02 |
| Comparative Example 4 | 1.71 | 0.02 |
| Comparative Example 5 | 1.84 | 0.02 |
| Comparative Example 6 | 1.90 | 0.02 |
| Comparative Example 7 | 1.92 | 0.02 |

(Measurement of Contact Angle)

The contact angle of the resist underlayer film with ultrapure water was measured using a full-automatic contact angle gauge CA-W150 type (manufactured by Kyowa Interface Science Co., Ltd.).

Each of the solutions of the resist underlayer film forming composition prepared in Example 1 to Example 16 and Comparative Example 1 to Comparative Example 7 was applied onto a silicon wafer using a spinner. The composition solution was heated on a hot plate at 240° C. for 1 minute to form a resist underlayer film and the contact angle of the resist underlayer film was measured (without washing of the film surface).

After the film formation, the film surface was immersed in OK 73 thinner (trade name; manufactured by Tokyo Ohka Kogyo Co., Ltd.; a thinner prepared by mixing PGME and PGMEA in a volume ratio of PGME:PGMEA=7:3) for 1 minute and was dried by high-speed spin drying at 100° C. for 30 seconds and then, the contact angle of the resist underlayer film was measured (with washing of film surface).

The obtained results are listed in Table 5.

TABLE 5

| Contact angle measurement (with ultrapure water) | | |
|---|---|---|
| | With washing of film surface (°) | Without washing of film surface (°) |
| Example 1 | 68.0 | 67.9 |
| Example 2 | 68.5 | 68.5 |
| Example 3 | 68.9 | 68.9 |
| Example 4 | 68.4 | 68.3 |
| Example 5 | 67.9 | 67.8 |
| Example 6 | 68.5 | 68.5 |
| Example 7 | 66.9 | 66.9 |
| Example 8 | 67.4 | 67.3 |
| Example 9 | 63.0 | 62.9 |
| Example 10 | 63.5 | 63.5 |
| Example 11 | 63.9 | 63.9 |
| Example 12 | 63.4 | 63.3 |
| Example 13 | 63.0 | 62.9 |
| Example 14 | 63.5 | 63.5 |
| Example 15 | 67.9 | 67.9 |
| Example 16 | 68.1 | 68.1 |
| Comparative Example 1 | 65.4 | 65.3 |
| Comparative Example 2 | 67.3 | 65.5 |
| Comparative Example 3 | 66.0 | 65.9 |
| Comparative Example 4 | 65.5 | 65.5 |
| Comparative Example 5 | 61.9 | 61.9 |
| Comparative Example 6 | 62.4 | 62.3 |
| Comparative Example 7 | 62.0 | 61.9 |

(Measurement of Shape after Edge Beat Rince (EBR)/Hump Height)

The shape of the resist underlayer film after EBR for removing an unnecessary film attached to an edge face of the substrate was evaluated using an optical microscope BX51M-34MD (manufactured by Olympus Corporation).

In addition, the height of a hump caused before EBR was measured using a surface shape measuring apparatus Dektak 6M (manufactured by ULVAC, Inc.).

Each of the solutions of the resist underlayer film forming composition prepared in Example 1 to Example 16 and Comparative Example 1 to Comparative Example 7 was applied onto a silicon wafer using a spinner. The composition solution was heated on a hot plate at 240° C. for 1 minute to form a resist underlayer film which was subjected to the measurement of the shape thereof after EBR and the measurement of the hump height. When the shape of a resist underlayer film after EBR was advantageous, the resist underlayer film was evaluated with "○" and when the shape of a resist underlayer film after EBR was disadvantage, the resist underlayer film was evaluated with "x".

The obtained results are listed in Table 6.

TABLE 6

| | Shape after EBR/hump height | |
|---|---|---|
| | Shape after EBR | Hump height (Å) |
| Example 1 | ○ | 600 |
| Example 2 | ○ | 800 |
| Example 3 | ○ | 900 |
| Example 4 | ○ | 800 |
| Example 5 | ○ | 700 |
| Example 6 | ○ | 800 |
| Example 7 | ○ | 700 |
| Example 8 | ○ | 700 |
| Example 9 | ○ | 800 |
| Example 10 | ○ | 800 |
| Example 11 | ○ | 700 |
| Example 12 | ○ | 800 |
| Example 13 | ○ | 700 |
| Example 14 | ○ | 700 |
| Example 15 | ○ | 600 |
| Example 16 | ○ | 700 |
| Comparative Example 1 | x | 5000 |
| Comparative Example 2 | ○ | 2000 |
| Comparative Example 3 | x | 5300 |
| Comparative Example 4 | x | 5500 |
| Comparative Example 5 | x | 6000 |
| Comparative Example 6 | x | 4800 |
| Comparative Example 7 | x | 5000 |

(Preparation of Organic Underlayer Film)

Into a 200 mL flask, 16.5 g of acenaphthylene, 1.5 g of 4-hydroxystyrene, and 60 g of 1,2-dichloroethane as a solvent were charged. Thereto, 1 g of trifluoro boron as a polymerization initiator was added and the resultant solution was heated to 60° C. and was subsequently subjected to the reaction for 24 hours. To this solution, 1 L of methanol and 500 g of water were added and the resultant solution was subjected to re-precipitation purification, followed by the filtering and drying of the resultant white solid to obtain 11 g of a white polymer. The obtained polymer below (corresponding to a polymer containing two unit structures of formulae below) was measured by $^{13}$C-NMR, $^{1}$H-NMR, and GPC and the constitution thereof was found to be acenaphthylene:4-hydroxystyrene=86:14 (molar ratio). Mw was 6,000 and Mw/Mn was 1.5.

To 10 g of the obtained polymer, 1.0 g of tetramethoxymethyl glycoluril (trade name: Powderlink 1174; manufactured by Mitsui Cytec Ltd.), 0.01 g of p-toluenesulfonic acid as a crosslinking catalyst, and 0.03 g of MEGAFAC R-30 (trade name; manufactured by Dainippon Ink and Chemicals, Inc. (present: DIC Corporation)) as a surfactant were added and the resultant mixture was dissolved in 101.57 g of propylene glycol monomethyl ether acetate and 25.39 g of propylene glycol monomethyl ether. Thereafter, the resultant solution was filtered using a polyethylene microfilter having a pore diameter of 0.10 μm and was further filtered using a polyethylene microfilter having a pore diameter of 0.05 μm to prepare a solution of a resist underlayer film forming composition (organic underlayer film forming composition) to be used for a lithography process by a multilayer film.

[Chemical Formula 16]

(Resist Patterning Evaluation)

An organic underlayer film (layer A) forming composition containing the above polymer was applied onto a silicon wafer and the composition was heated on a hot plate at 240° C. for 1 minute to obtain an organic underlayer film (layer A) having a film thickness of 250 nm. On the organic underlayer film (layer A), each of the Si-containing resist underlayer film (layer B) compositions obtained in Example 1 to Example 16 and Comparative Example 1 to Comparative 7 was applied and the composition was heated on a hot plate at 240° C. for 1 minute to obtain a Si-containing resist underlayer film (layer B) having a film thickness of 40 nm. On the resist underlayer film (layer B), a commercially available photoresist solution (trade name: PAR 855; manufactured by Sumitomo Chemical Co., Ltd.) was applied with a spinner and the solution was heated on a hot plate at 100° C. for 1 minute to form a photoresist film (layer C) having a film thickness of 150 nm. The patterning of the resist was performed using an immersion exposing machine (TWINSCAN XT: 1900Gi scanner; manufactured by ASML Holding N.Y.; wavelength: 193 nm, NA, σ: 1.20, 0.94/0.74 (C-quad), immersion liquid: water). The target was a photoresist after the development having both a line width and a width between lines of 0.05 μm, which is a so-called line and space (dense line) pattern, and the exposure was performed through a mask set to have 15 lines. Thereafter, the resist pattern was baked on a hot plate at 105° C. for 60 seconds, was cooled down, and was developed by a 60 seconds single paddle process according to JIS with a 2.38% tetramethylammonium hydroxide developer.

In addition, the evaluation of the pattern width fluctuation (LWR) was performed by measuring the pattern width at 11 points using an S-9380 (II)-type Hitachi high-resolution FEB measuring apparatus (manufactured by Hitachi High-Tech Fielding Corporation) and calculating the average value of the measured values.

LWR means 3σ value of the line width $W_n$ measured at a measuring part $y_n$ relative to the number N of data in a y direction (see FIG. 1). The lower the LWR value is, the more advantageous the pattern width is.

The obtained values are listed in Table 8.

TABLE 7

| | Lithography evaluation | |
|---|---|---|
| | Result of lithography | LWR value |
| Example 1 | Advantageous | 7.40 |
| Example 2 | Advantageous | 6.96 |
| Example 3 | Advantageous | 6.93 |
| Example 4 | Advantageous | 6.98 |
| Example 5 | Advantageous | 7.43 |
| Example 6 | Advantageous | 6.86 |
| Example 7 | Advantageous | 7.53 |
| Example 8 | Advantageous | 6.88 |
| Example 9 | Advantageous | 7.70 |
| Example 10 | Advantageous | 6.90 |
| Example 11 | Advantageous | 6.73 |
| Example 12 | Advantageous | 6.45 |
| Example 13 | Advantageous | 6.69 |
| Example 14 | Advantageous | 6.40 |
| Example 15 | Advantageous | 6.80 |
| Example 16 | Advantageous | 6.50 |

TABLE 7-continued

| | Lithography evaluation | |
|---|---|---|
| | Result of lithography | LWR value |
| Comparative Example 1 | Advantageous | 7.50 |
| Comparative Example 2 | Advantageous | 7.45 |
| Comparative Example 3 | Advantageous | 7.58 |
| Comparative Example 4 | Advantageous | 7.67 |
| Comparative Example 5 | Advantageous | 6.75 |
| Comparative Example 6 | Advantageous | 6.79 |
| Comparative Example 7 | Advantageous | 6.70 |

There was obtained the result that the F-type polymer having alkoxysilane that is the fluorine-containing highly branched polymer defined in the present invention can improve various characteristics by being added in a resist underlayer film forming composition having a silicon atom in the backbone thereof.

First, when the results of measuring the contact angle between before and after washing of the film surface are compared with each other, although with respect to the resist underlayer films obtained from the resist underlayer film forming compositions of Example 1 to Example 16, there was observed substantially no change in the contact angle between before and after washing, with respect to the resist underlayer film (using an F polymer 5 containing no alkoxysilane) obtained from the resist underlayer film forming composition of Comparative Example 2, it resulted in that a change in the contact angle was caused between before and after washing. It can be expected that this is because when, in the resist underlayer films in Examples, the F-type polymer contains an alkoxysilane, a silanol in the resist underlayer film forming composition is condensed with a silanol generated from the alkoxysilane in the F-type polymer, so that the F-type polymer is bonded in the film surface.

In addition, there was obtained the result that in the resist underlayer films obtained from the resist underlayer film forming compositions of Example 1 to Example 16, the shape after EBR and the hump height are largely improved in comparison with the resist underlayer films obtained from the resist underlayer film forming compositions of Comparative Example 1 to Comparative Example 7.

Furthermore, there was obtained the result that although the resist underlayer films obtained from the resist underlayer film forming compositions of Example 1 to Example 16 are equal to the resist underlayer films obtained from the resist underlayer film forming compositions of Comparative Example 1 to Comparative Example 7 with respect to lithography characteristics (shape), the LWR of the resist underlayer films obtained from the resist underlayer film forming compositions of Example 1 to Example 16 is improved in general in comparison with that of the resist underlayer films obtained from the resist underlayer film forming compositions of Comparative Example 1 to Comparative Example 7. Particularly, in Examples 2 to 4 having a polar functional group, a large improving tendency thereof was confirmed.

INDUSTRIAL APPLICABILITY

The present invention can provide a resist underlayer film forming composition for lithography for forming a resist underlayer film capable of being used as a hardmask. In a process of removing an unnecessary film attached to an edge face of the substrate as a hump when the composition of the present invention is applied onto the substrate, the composition of the present invention can reduce the height of the hump, so that the composition of the present invention is useful for such a process.

The invention claimed is:

1. A resist underlayer film forming composition for lithography comprising:

as a component (I), a fluorine-containing highly branched polymer obtained by polymerizing a monomer A having two or more radical polymerizable double bonds in the molecule thereof, a monomer B having a fluoroalkyl group and at least one radical polymerizable double bond in the molecule thereof, and a monomer D having a silicon atom-containing organic group and at least one radical polymerizable double bond in the molecule thereof, in the presence of a polymerization initiator C in a content of 5% by mole or more and 200% by mole or less, based on the total mole of the monomer A, the monomer B, and the monomer D; and as a component (II), a hydrolyzable silane compound, a hydrolysis product thereof, a hydrolysis-condensation product thereof, or a silicon-containing compound that is a combination of these compounds.

2. The resist underlayer film forming composition according to claim 1, wherein the component (I) is a fluorine-containing highly branched polymer obtained by polymerizing a monomer A having two or more radical polymerizable double bonds in the molecule thereof, a monomer B having a fluoroalkyl group and at least one radical polymerizable double bond in the molecule thereof, and a monomer D having a silicon atom-containing organic group and at least one radical polymerizable double bond in the molecule thereof, in the presence of a polymerization initiator C having a fluoroalkyl group in the molecule thereof, in a content of 5% by mole or more and 200% by mole or less, based on the total mole of the monomer A, the monomer B, and the monomer D.

3. The resist underlayer film forming composition according to claim 1, wherein the monomer A of the component (I) is a compound having any one of or both of a vinyl group and a (meth)acrylic group.

4. The resist underlayer film forming composition according to claim 1, wherein the monomer A of the component (I) is a divinyl compound or a di(meth)acrylate compound.

5. The resist underlayer film forming composition according to claim 1, wherein the monomer A of the component (I) is ethylene glycol di(meth)acrylate.

6. The resist underlayer film forming composition according to claim 1, wherein the component (I) is obtained by using the monomer A, the monomer B, and the monomer D in a ratio of the monomer B of 0.05 to 3 mole and a ratio of the monomer D of 0.05 to 5 mole, relative to 1 mole of the monomer A.

7. The resist underlayer film forming composition according to claim 1, wherein the monomer B and the monomer D of the component (I) are individually a compound having at least one vinyl group or at least one (meth)acrylic group.

8. The resist underlayer film forming composition according to claim 1, wherein the monomer B of the component (I) is a compound of Formula (1):

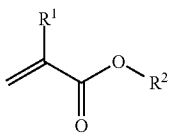

Formula (1)

(in Formula (1), $R^1$ is a hydrogen atom or a methyl group, and $R^2$ is a $C_{2-12}$ fluoroalkyl group optionally substituted with a hydroxy group).

9. The resist underlayer film forming composition according to claim 1, wherein the monomer B of the component (1) is a compound of Formula (2):

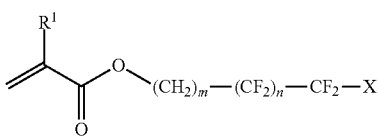

Formula (2)

(in Formula (2), $R^1$ is a hydrogen atom or a methyl group; X is a hydrogen atom or a fluorine atom; m is an integer of 1 or 2; and n is an integer of 0 to 5).

10. The resist underlayer film forming composition according to claim 1, wherein the monomer D of the component (I) is a compound of Formula (3):

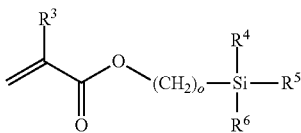

Formula (3)

(in Formula (3), $R^3$ is a hydrogen atom or a methyl group; $R^4$, $R^5$, and $R^6$ are individually a $C_{1-20}$ alkoxy group, a $C_{1-10}$ alkyl group, a $C_{2-10}$ alkenyl group, a $C_{2-10}$ alkynyl group, or a halogen-substituted group of these groups; and o is an integer of 1 to 10).

11. The resist underlayer film forming composition according to claim 1, wherein the polymerization initiator C of the component (I) is an azo-based polymerization initiator.

12. The resist underlayer film forming composition according to claim 11, wherein the polymerization initiator C of the component (I) is dimethyl 2,2'-azobisisobutyrate.

13. The resist underlayer film forming composition according to claim 11, wherein the polymerization initiator C of the component (I) is 2,2'-azobis(2,4,4-trimethylpentane).

14. The resist underlayer film forming composition according to claim 1, wherein the silicon-containing compound of the component (II) is at least one hydrolyzable silane compound selected from the group consisting of a silane compound of Formula (4):

$$R^7_a Si(R^8)_{4-a}$$ Formula (4)

(in Formula (4), $R^7$ is an alkyl group, an aryl group, a halogenated alkyl group, a halogenated aryl group, an alkenyl group, or a monovalent organic group having an epoxy group, an acryloyl group, a methacryloyl group, a mercapto group, or a cyano group and $R^7$ is bonded to the silicon atom in Formula (4) through a Si—C bond; and $R^8$ is an alkoxy group, an acyloxy group, or a halogen atom; and a is an integer of 0 to 3) and a silane compound of Formula (5):

$$[R^9_c Si(R^{10})_{3-c}]_2 Y_b$$ Formula (5)

(in Formula (5), $R^9$ is an alkyl group; $R^{10}$ is an alkoxy group, an acyloxy group, or a halogen atom; Y is an alkylene group or an arylene group; and b is an integer of 0 or 1 and c is an integer of 0 or 1, where when b=0, a single bond of Si—Si is formed), a hydrolysis product thereof, a hydrolysis-condensation product thereof, or a combination of these compounds.

15. The resist underlayer film forming composition according to claim 14, wherein the component (II) contains a polymer containing a hydrolysis-condensation product of the silane compound of Formula (4).

16. The resist underlayer film forming composition according to claim 1, further comprising an acid as a hydrolysis catalyst.

17. The resist underlayer film forming composition according to claim 1, further comprising water.

18. A resist underlayer film obtained by applying the resist underlayer film forming composition as claimed in claim 1 onto a semiconductor substrate and baking the composition.

19. A method of producing a semiconductor device, the method comprising:
a process of applying the resist underlayer film forming composition as claimed in claim 1 onto a semiconductor substrate and baking the composition to form a resist underlayer film;
a process of applying a composition for a resist onto the resist underlayer film to form a resist film;
a process of exposing the resist film to light;
a process of developing the resist after exposure to obtain a resist pattern;
a process of etching the resist underlayer film according to the resist pattern; and
a process of processing the semiconductor substrate according to the patterned resist film and the patterned resist underlayer film.

20. A method of producing a semiconductor device, the method comprising:
a process of forming an organic underlayer film on a semiconductor substrate;
a process of applying the resist underlayer film forming composition as claimed in claim 1 onto the organic underlayer film and baking the composition to form a resist underlayer film;
a process of applying a composition for a resist onto the resist underlayer film to form a resist film;
a process of exposing the resist film to light;
a process of developing the resist after exposure to obtain a resist pattern;
a process of etching the resist underlayer film according to the resist pattern;
a process of etching the organic underlayer film according to a pattern of the patterned resist underlayer film; and
a process of processing the semiconductor substrate according to a pattern of the patterned organic underlayer film.

* * * * *